US012237262B2

(12) United States Patent
Wu et al.

(10) Patent No.: US 12,237,262 B2
(45) Date of Patent: Feb. 25, 2025

(54) SEMICONDUCTOR PACKAGE WITH IMPROVED INTERPOSER STRUCTURE

(71) Applicant: Taiwan Semiconductor Manufacturing Company, Ltd., Hsinchu (TW)

(72) Inventors: Yi-Wen Wu, New Taipei (TW); Techi Wong, Zhubei (TW); Po-Hao Tsai, Zhongli (TW); Po-Yao Chuang, Hsin-Chu (TW); Shih-Ting Hung, New Taipei (TW); Shin-Puu Jeng, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 18/502,307

(22) Filed: Nov. 6, 2023

(65) Prior Publication Data

US 2024/0071909 A1  Feb. 29, 2024

Related U.S. Application Data

(63) Continuation of application No. 17/400,729, filed on Aug. 12, 2021, now Pat. No. 11,848,265, which is a
(Continued)

(51) Int. Cl.
*H01L 23/522*  (2006.01)
*H01L 21/56*  (2006.01)
(Continued)

(52) U.S. Cl.
CPC ........ *H01L 23/5226* (2013.01); *H01L 21/561* (2013.01); *H01L 21/563* (2013.01);
(Continued)

(58) Field of Classification Search
CPC ............ H01L 23/3114; H01L 23/3142; H01L 23/3121; H01L 23/49811; H01L 23/498;
(Continued)

(56) References Cited

U.S. PATENT DOCUMENTS 7,368,821 B2 * 5/2008 Kim ...................... H05K 3/303
257/784
8,993,380 B2   3/2015 Hou et al.
(Continued)

OTHER PUBLICATIONS

U.S. Office Action for U.S. Appl. No. 18/358,491, dated Jul. 1, 2024.

*Primary Examiner* — Alia Sabur
(74) *Attorney, Agent, or Firm* — Birch, Stewart, Kolasch & Birch, LLP

(57) ABSTRACT

A semiconductor package is provided. The semiconductor package includes an encapsulating layer, a semiconductor die formed in the encapsulating layer, and an interposer structure covering the encapsulating layer. The interposer structure includes an insulating base having a first surface facing the encapsulating layer, and a second surface opposite the first surface. The interposer structure also includes insulating features formed on the first surface of the insulating base and extending into the encapsulating layer. The insulating features is arranged in a matrix and faces a top surface of the semiconductor die. The interposer structure further includes first conductive features formed on the first surface of the insulating base and extending into the encapsulating layer. The first conductive features surround the matrix of the insulating features.

20 Claims, 29 Drawing Sheets

Related U.S. Application Data continuation of application No. 16/406,600, filed on May 8, 2019, now Pat. No. 11,094,625.

(60) Provisional application No. 62/787,493, filed on Jan. 2, 2019.

(51) Int. Cl.
  *H01L 23/00* (2006.01)
  *H01L 23/31* (2006.01)
  *H01L 23/48* (2006.01)
  *H01L 23/528* (2006.01)

(52) U.S. Cl.
  CPC ...... *H01L 23/3128* (2013.01); *H01L 23/3171* (2013.01); *H01L 23/481* (2013.01); *H01L 23/5283* (2013.01); *H01L 24/09* (2013.01); *H01L 24/17* (2013.01); *H01L 24/32* (2013.01); *H01L 24/73* (2013.01); *H01L 24/96* (2013.01); *H01L 2224/02373* (2013.01); *H01L 2224/02379* (2013.01); *H01L 2224/02381* (2013.01); *H01L 2224/0401* (2013.01); *H01L 2224/73203* (2013.01)

(58) Field of Classification Search
  CPC ....... H01L 23/5385; H01L 2224/17181; H01L 2224/16227; H01L 2224/1624; H01L 2224/04105; H01L 2224/06181; H01L 2224/06517; H01L 24/05; H01L 2924/18301; H01L 2225/107; H05K 2201/09781

See application file for complete search history.

(56) References Cited

U.S. PATENT DOCUMENTS

| | | | |
|---|---|---|---|
| 9,281,254 | B2 | 3/2016 | Yu et al. |
| 9,299,649 | B2 | 3/2016 | Chiu et al. |
| 9,318,442 | B1* | 4/2016 | Chen ................... H01L 23/5384 |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 2002/0028533 | A1 | 3/2002 | Tang et al. |
| 2002/0089054 | A1 | 7/2002 | Fukasawa et al. |
| 2008/0169555 | A1 | 7/2008 | Topacio et al. |
| 2010/0148332 | A1 | 6/2010 | Kajiki |
| 2011/0286191 | A1 | 11/2011 | Kim et al. |
| 2013/0234317 | A1* | 9/2013 | Chen ....................... H01L 25/50 |
| | | | 257/E21.511 |
| 2015/0262900 | A1 | 9/2015 | Wang et al. |
| 2017/0154878 | A1 | 6/2017 | Kim et al. |
| 2017/0311445 | A1 | 10/2017 | Chang et al. |
| 2018/0102313 | A1 | 4/2018 | Shih |
| 2019/0103385 | A1 | 4/2019 | Karhade et al. |
| 2019/0139786 | A1 | 5/2019 | Yeh |
| 2019/0198437 | A1 | 6/2019 | Kim et al. |
| 2019/0273044 | A1 | 9/2019 | Fu et al. |
| 2020/0043854 | A1* | 2/2020 | Oh .......................... H01L 24/16 |
| 2020/0185326 | A1* | 6/2020 | Sato ..................... H01L 23/3142 |

* cited by examiner

SEMICONDUCTOR PACKAGE WITH IMPROVED INTERPOSER STRUCTURE

PRIORITY CLAIM AND CROSS-REFERENCE

This application is a Continuation of pending U.S. patent application Ser. No. 17/400,729, filed Aug. 12, 2021, which is a Continuation of U.S. patent application Ser. No. 16/406,600, filed May 8, 2019, which claims the benefit of U.S. Provisional Application No. 62/787,493, filed on Jan. 2, 2019, and entitled "Semiconductor package structure with interposer and method for forming the same", the entirety of which is incorporated by reference herein.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor integrated circuit (IC) industry has experienced rapid growth. With the evolving of semiconductor technologies, semiconductor chips/dies are becoming increasingly smaller. Accordingly, the packaging of the semiconductor dies becomes more difficult, which adversely affects the yield of the packaging.

In one conventional package technology, dies are sawed from wafers before they are packaged. An advantageous feature of this packaging technology is the possibility of forming fan-out packages. Another advantageous feature of this packaging technology is that "known-good-dies" are packaged, and defective dies are discarded, and hence money and effort are not wasted on the defective dies.

However, since device sizes continue to decrease, fabrication processes continue to become more difficult to perform, and additional problems arise that should be addressed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1E-1 shows a cross-sectional representation of a semiconductor package, in accordance with some embodiments.

FIG. 1E-2 shows a cross-sectional representation of a semiconductor package, in accordance with some embodiments.

DETAILED DESCRIPTION

Figure 1A:
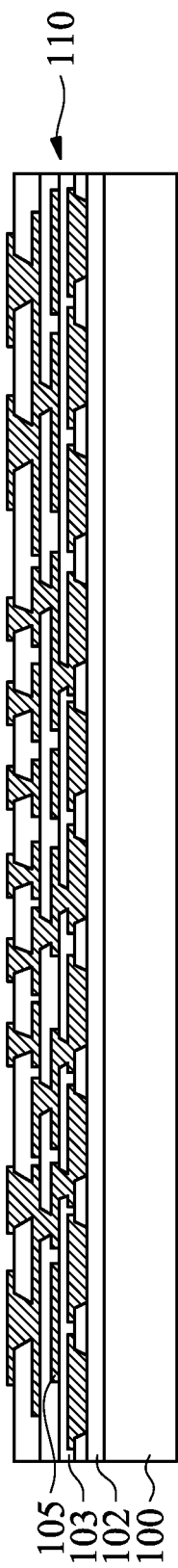
FIGS. 1A to 1E show cross-sectional representations of various stages of forming a semiconductor package, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

A semiconductor package with improved interposer structure and the method of forming the same are provided in accordance with various exemplary embodiments. The various stages of forming the semiconductor package are illustrated. The variations of the embodiments are also discussed. Throughout the various views and illustrative embodiments, like reference numbers are used to designate like elements.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of the semiconductor package includes an interposer structure formed over the encapsulating layer that covers and surrounds a semiconductor die on the interconnect structure. The interposer structure includes an insulating base and island layers arranged on the surface of the insulating base that faces the encapsulating layer. The island layers facilitate the flowability of an encapsulating material between the semiconductor die and the interposer structure. As a result, the gap between the semiconductor die and the interposer structure can be filled with the subsequently formed encapsulating layer to prevent voids from forming in the gap, thereby increasing the reliability of the semiconductor package. In some embodiments, the interposer structure includes dummy through-vias formed in the insulating base. Those dummy through-vias enhance the rigidity for the interposer structure. As a result, the deformation or warpage of the interposer structure can be mitigated or eliminated, thereby reducing the package warpage. In some embodiments, the interposer structure includes a passivation layer covering the surface of the insulating base opposite the encapsulating layer. The passivation layer has one or more recesses extended along one or more peripheral edges of the insulating base. The recess prevents the encapsulating material from creeping across the top surface of the passivation layer to contaminate pads that are exposed from the passivation layer for external connection. As a result, the yield and reliability of the semiconductor package can be increased.

FIGS. 1A to 1E show cross-sectional representations of various stages of forming a semiconductor package 10a, in accordance with some embodiments. A carrier substrate 100 covered by an adhesive layer 102 is provided, as shown in FIG. 1A in accordance with some embodiments. In some embodiments, the carrier substrate 100 includes, for example, silicon based materials, such as glass or silicon oxide, or other materials, such as aluminum oxide, combinations of any of these materials, or the like. The adhesive layer 102 is placed over the carrier substrate 100 in order to assist in the formation of overlying structures to the carrier substrate 100. In some embodiments, the adhesive layer 102 is a die attached film (DAF), such as an epoxy resin, a phenol resin, silica filler, or a combination thereof, and is applied using a lamination technique. The adhesive layer 102 may be a release film such as a light-to-heat-conversion (LTHC) film or a combination with a die attached film (DAF) thereof. However, any other suitable material and method of formation may be utilized.

After the adhesive layer 102 has been placed over the carrier substrate 100, an interconnect structure 110 is formed over the carrier substrate 100 via the adhesive layer 102. The interconnect structure 110 may be used as a fan-out redistribution (RDL) structure for routing. In some embodiments, the interconnect structure 110 includes one or more conductive layers 105 (such as two or three conductive layers) embedded within one or more dielectric layers 103 (such as three or four dielectric layers) that provide not only conductive routing for signals, but which may also provide structures such as integrated inductors or capacitors. In some embodiments, the dielectric layer 103 includes a material such as polybenzoxazole (PBO), polyimide (PI), one or more other suitable polymer materials, or a combination thereof, although any suitable material (such as silicon oxide, silicon carbide, silicon nitride, silicon oxynitride, one or more other suitable materials, or a combination thereof) may be utilized. The dielectric layers 103 may be formed by, e.g., a spin-coating process, although any suitable method may be used. After the first one of the dielectric layers 103 has been formed, openings may be made through the first one of the dielectric layers 103.

Once the first one of the dielectric layers 103 has been formed and patterned, a first one of the conductive layers 105 (such as copper) is formed over the first one of the dielectric layers 103 and through the openings that were formed within the first one of the dielectric layers 103. In some embodiments, the first one of the conductive layers 105 is formed by a suitable formation process such as electroplating, chemical vapor deposition (CVD) or sputtering. However, while the material and methods discussed are suitable to form the conductive layer 105, this material is merely exemplary. Any other suitable materials, such as AlCu or Au, and any other suitable processes of formation, such as CVD or physical vapor deposition (PVD), may be used to form the conductive layers 105.

Once the first one of the conductive layers 105 has been formed, a second one of the dielectric layers 103 and a second one of the conductive layers 105 may be formed by repeating steps that are similar to the first one of the dielectric layers 103 and the first one of the conductive layers 105. These steps may be repeated as desired in order to electrically connect between the conductive layers 105. In some embodiments, the deposition and patterning of the conductive layers 105 and the dielectric layers 103 may be continued until the interconnect structure 110 have a desired number of layers.

Figure 1B:
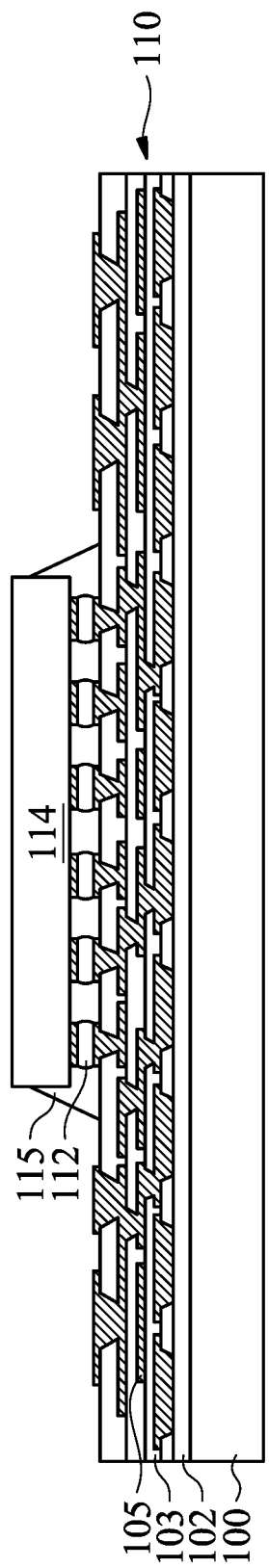

Afterwards, one or more semiconductor dies 114 is formed over the interconnect structure, as shown in FIG. 1B, in accordance with some embodiments. The semiconductor die 114 is sawed from a wafer, and may be a "known-good-die". In some embodiments, the semiconductor die 114 provides logic functions for the structures. For example the semiconductor die 114 is a system-on-chip (SoC) chip, although any suitable semiconductor die may be utilized. In some embodiments, the semiconductor die 114 includes a substrate, active devices (not shown), metallization layers (not shown), and contact pads. The substrate may include bulk silicon, doped or undoped, or an active layer of a silicon-on-insulator (SOI) substrate. Generally, an SOI substrate includes a layer of a semiconductor material such as silicon, germanium, silicon germanium, or combinations thereof. The active devices may be formed using any suitable methods either within or else on the substrate. The metallization layers are formed over the substrate and the active devices and are designed to connect the various active devices to form functional circuitry. In some embodiments, the first metallization layers are formed of alternating layers of dielectric and conductive material and may be formed through any suitable process (such as deposition, damascene, dual damascene, etc.). The contact pads are formed over and in electrical contact with the metallization layers. The contact pads may include aluminum or copper and may be formed using a deposition process, such as sputtering, to form a layer of material and the layer of material may then be patterned via a suitable process (such as lithography and etching) to form the contact pads.

External connectors 112 is formed to provide conductive regions for contact between the semiconductor die 114 and the interconnect structure 110. The external connectors 112 may be conductive bumps (e.g., microbumps) or conductive pillars utilizing materials such as solder and copper. In some embodiments, the external connectors 112 are contact bumps. The external connectors 112 may comprise a material such as tin, or other suitable materials, such as silver, lead-free tin, or copper.

In some embodiments in which the external connectors 112 is formed by initially forming a layer of metal (e.g., tin) via, for example, evaporation, electroplating, printing, solder transfer, or ball placement. Once the layer of tin has been formed on the structure, a reflow may be performed in order to shape the layer of tin into the desired bump shape. In some other embodiments, the external connectors 112 are conductive pillars, the external connectors 112 may be formed by initially placing a photoresist and then patterning the photoresist into the desired pattern for the conductive pillars. A plating process is then utilized to form the conductive material (e.g., copper) in connection with the contact pads. However, any suitable methods may be utilized.

In some embodiments, the semiconductor die 114 is placed on the interconnect structure 110 using, e.g., a pick and place tool. An optional under bump metallization (UBM) layer (not shown) may be formed on the interconnect structure 110 prior to the placement of the semiconductor die 114. In some embodiments, after the semiconductor die 114 is bonded onto the interconnect structure 110, an underfill material 115 is formed between the interconnect structure 110 and the semiconductor die 114. The underfill material 115 is a material used to protect and support the semiconductor die 114 from operational and environmental degradation, such as stresses caused by the generation of heat during operation. The underfill material 115 may be made of an epoxy-based resin or other protective material. In some embodiments, the formation of the underfill material 115 involves an injecting process, a dispensing process, a film lamination process, one or more other applicable processes, or a combination thereof. In some embodiments, a thermal curing process is then used to cure the underfill material 115.

Figure 1C:
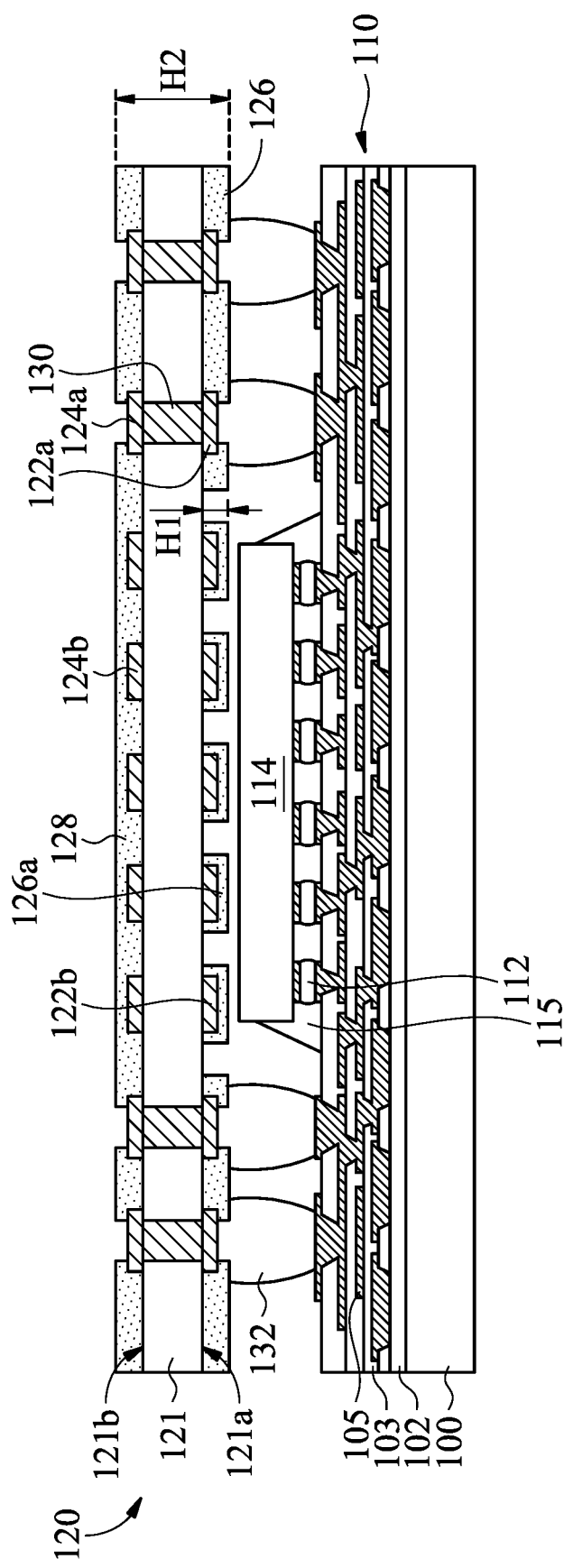
Figure 1D:
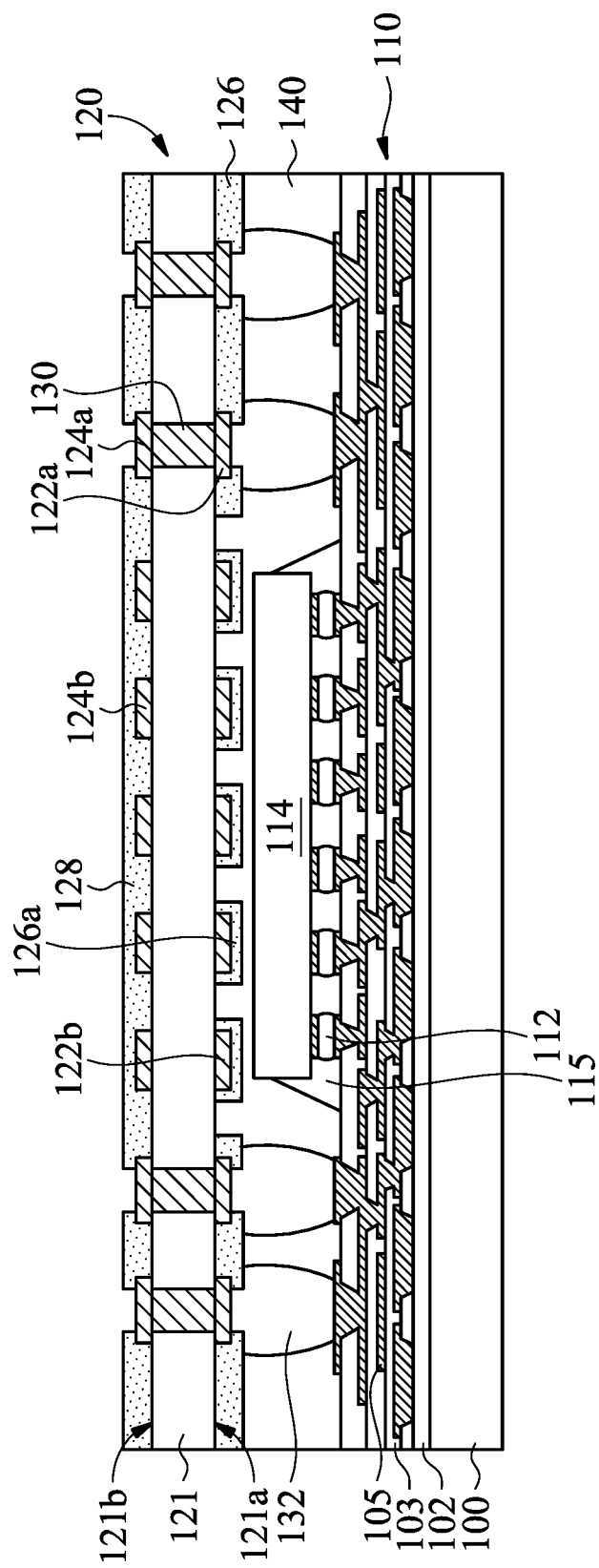

Next, an interposer structure 120 is provided and is ready to be bonded onto the interconnect structure 110 and cover the semiconductor die, as shown in FIGS. 1C and 1D in accordance with some embodiments. In some embodiments, the interposer structure 120 includes an insulating base 121 with conductive features 122a, 122b, 124a, and 124b and passivation layers 126 and 128 on opposite surfaces 121a and 121b of the insulating base 121, and through-vias 130 in the insulating base 121, as shown in FIG. 1C. In some other embodiments, one or more conductive features (such as trace layers or routing layers) are built within the insulating base 121.

Figure 2A:
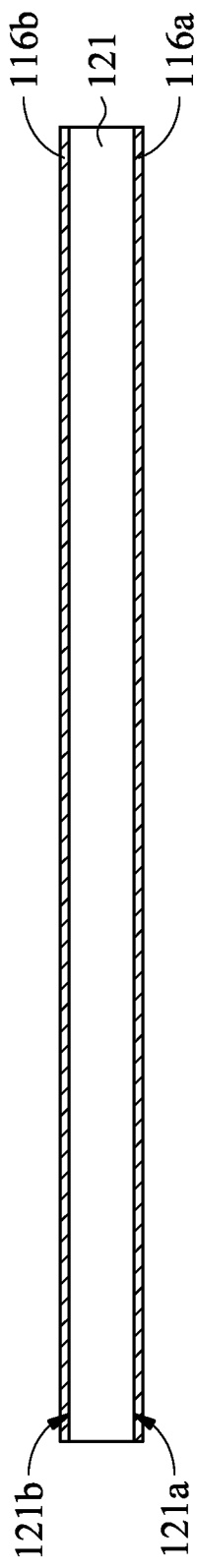
FIGS. 2A to 2E show cross-sectional representations of various stages of forming an interposer structure, in accordance with some embodiments.

FIGS. 2A to 2E show cross-sectional representations of various stages of forming the interposer structure 120 shown in FIG. 1C, in accordance with some embodiments. Conductive films 116a and 116b are formed over opposite surfaces 121a and 121b of the insulating base 121, as shown in FIG. 2A in accordance with some embodiments. The conductive films 116a and 116b may be used to assist in a subsequent electroplating process. In some embodiments, the insulating base 121 is made of or include a polymer material, a ceramic material or a glass. In some other embodiments, the insulating base 121 include a substrate of ceramic material, a metal material, or a semiconductor material with insulating layers on both sides of the substrate.

The conductive films 116a and 116b may be made of or include aluminum, copper, cobalt, gold, titanium, one or more other suitable materials, or a combination thereof. The conductive films 116a and 116b may be formed using a thermal compression process, a PVD process, a CVD process, a lamination process, a printing process, one or more other application processes, or a combination thereof. However, embodiments of the disclosure are not limited thereto. In some other embodiments, the conductive films 116a and 116b are not formed.

Figure 2B:
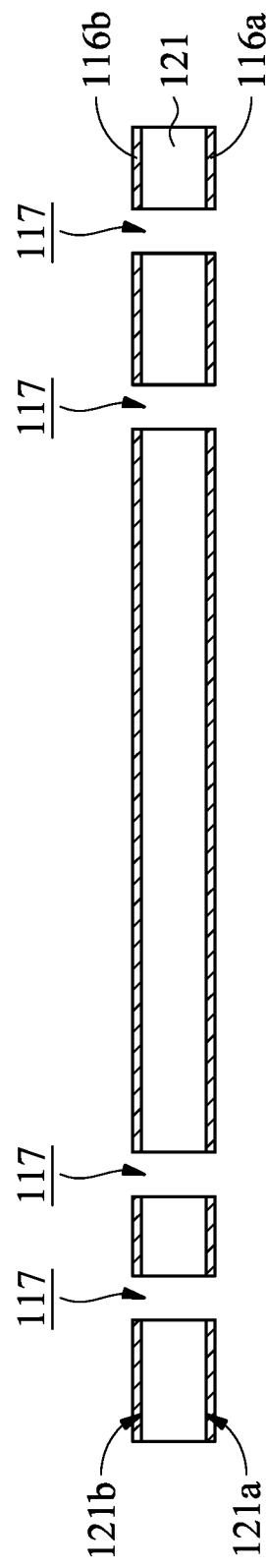

After the conductive films 116a and 116b are formed, the conductive films 116a and 116b and the insulating base 121 are partially removed to form through-openings 117, as shown in FIG. 2B, in accordance with some embodiments. In some embodiments, the through-openings 117 penetrate through the insulating base 121 and the conductive films 116a and 116b. The through-openings 117 may be formed using an energy beam drilling process, a mechanical drilling process, photolithography and etching processes, one or more other applicable processes, or a combination thereof. For example, the through-openings 117 are formed using the energy beam drilling process, such as a laser drilling process, an ion beam drilling process, an electron beam drilling process, a plasma beam drilling process, one or more other applicable processes, or a combination thereof.

Afterwards, a seed layer (not shown) is formed over the structure shown in FIG. 2B in accordance with some embodiments. The seed layer extends over the conductive films 116a and 116b. The seed layer also extends over sidewalls of the through-openings 117. Afterwards, patterned photoresist layers (not shown) are formed on the portion of the seed layer extending over the conductive films 116a and 116b. The patterned photoresist layers have openings that partially expose the seed layer and define patterns of conductive features to be formed on the insulating base 121 later. Then, one or more conductive materials are electroplated on the portions of the seed layer not covered by the patterned photoresist layers. Afterwards, the patterned photoresist layers are removed. One or more etching processes are used to remove the portions of the seed layer originally covered by the patterned photoresist layers. The portions of the conductive films 116a and 116b originally covered by the patterned photoresist layers are also removed during the one or more etching processes.

Figure 2C:
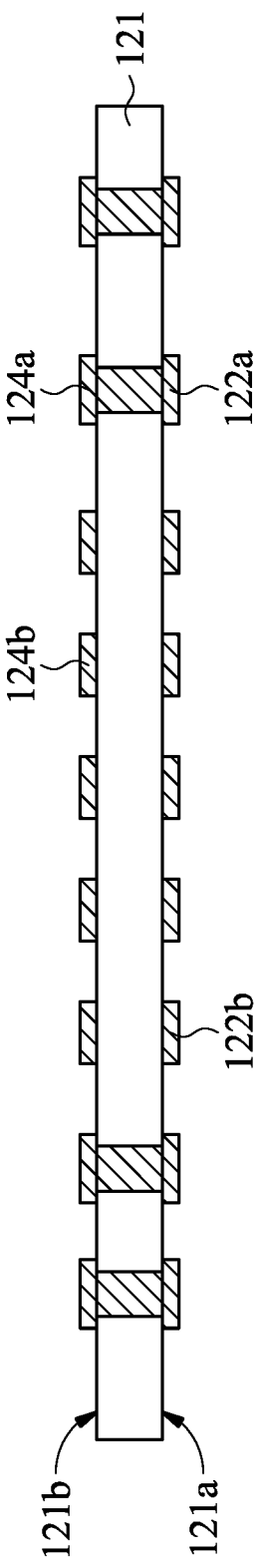

After the one or more etching processes, the opposite surfaces 121a and 121b of the insulating base 121 are partially exposed, as shown in FIG. 2C in accordance with some embodiments. The remaining portions of the electroplated conductive material, the remaining seed layer, and the remaining conductive films 116a and 116b together form conductive features 122a, 122b, 124a, and 124b and through-vias 130 with desired patterns. The through-vias 130 are formed in the through-openings 117 to penetrate through the insulating base 121 and provide electrical connections between elements to be positioned on the opposite surfaces 121a and 121b of the insulating base 121.

In some embodiments, the conductive features 122a and 124a are used as pads and respectively in contact with opposite ends of the through-vias 130. In some embodiments, the conductive features 122b serve as dummy pads with island-shaped and therefore are referred to as island layers. In some embodiments, the conductive features 124b serve as trace layers with desired circuit pattern. In some embodiments, the conductive features 122b and 124b are surrounding by the conductive features 122a and 124a.

Figure 2D:
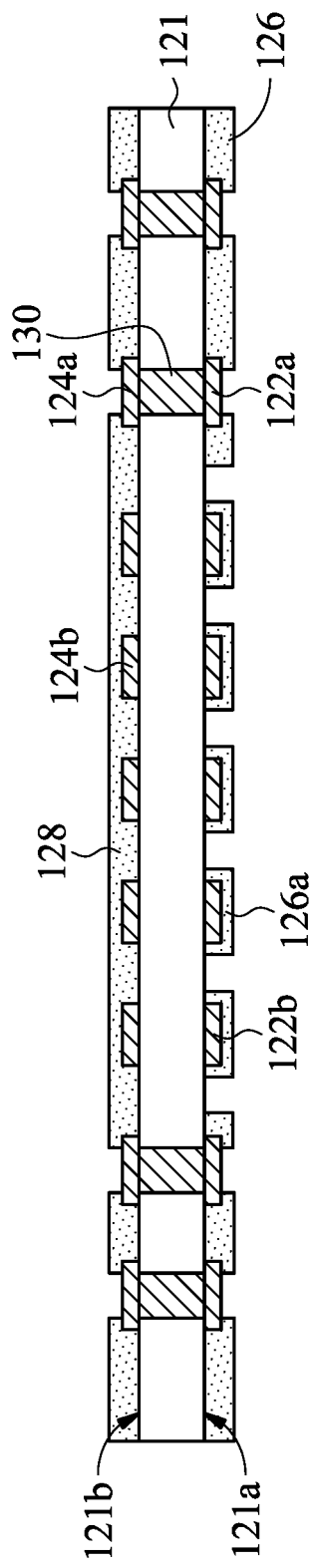

Passivation layers 126 and 128 are respectively formed over the opposite surfaces 121a and 121b of the insulating base 121, as shown in FIG. 2D in accordance with some embodiments. The passivation layers 126 and 128 may be made of or include epoxy-based resin, polyimide (PI), polybenzoxazole (PBO), solder resist (SR), Ajinomoto build-up film (ABF), one or more other suitable materials, or a combination thereof. The passivation layer 126 has multiple openings that partially expose each of the conductive features 122a and entirely expose all of the conductive features 122b. In some embodiments, each of the exposed conductive features 122b (i.e., the island layers) are covered and surrounded by a capping layer 126a. Those capping layers 126a are separated from each other. In some embodiments, those capping layers 126a and the passivation layer 126 are formed of a same layer, such as an insulating material layer. The passivation layer 128 has multiple openings that partially expose each of the conductive features 124a and entirely covering all of the conductive features 122b. The formation of the passivation layers 126 and 128 may involve a coating process and a photolithography process. The coating process may include a spin coating process, a spray coating process, a lamination process, one or more other applicable processes, or a combination thereof.

Figure 2E:
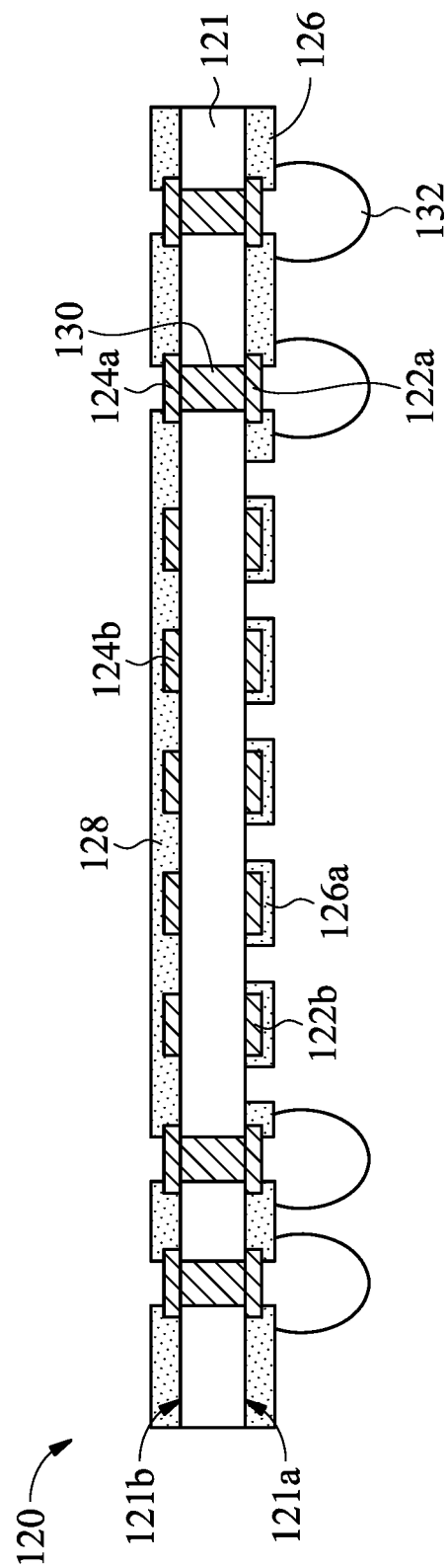

Connectors 132 are respectively formed on and in direct contact with the conductive features 122a, as shown in FIG. 2E in accordance with some embodiments. In some embodiments, connectors 132 are tin-containing solder elements. The tin-containing solder elements may further include copper, silver, gold, aluminum, lead, one or more other suitable materials, or a combination thereof. In some embodiments, the tin-containing solder elements are lead free. The formation of the connectors 132 may involve ball mount process, or one or more plating processes (such as electroplating processes) and/or one or more reflow processes. In some embodiments, the connectors 132 are conductive pillars and is made of or include copper, aluminum, titanium, cobalt, gold, tin-containing alloys, one or more other suitable materials, or a combination thereof. The conductive pillars may be formed using an electroplating process, an electroless plating process, a PVD process, a CVD process, one or more other applicable processes, or a combination thereof. Afterwards, a singulation process may be carried out to saw through the structure. As a result, multiple interposer structures 120 are formed. In FIG. 2E, one of the interposer structures 120 is shown. In some embodiments, the capping layer 126a of the interposer structure 120 has a height H1 and the interposer structure 120 has a height H2, as shown in FIG. 1C. In some embodiments, the height H1 is in a range from about 3 μm to about 40 μm. The height H2 is in a range from about 50 μm to about 900 μm.

Referring back to FIG. 1C, the interposer structure 120 is mounted onto the interconnect structure 110 and covers the semiconductor die 114 by bonding the connectors 132 to the interconnect structure 110, in accordance with some embodiments. The conductive features 124a (i.e., pads) of the interposer structure 120 is electrically coupled to the interconnect structure 110 by the through-vias 130, the conductive features 122a (i.e., pads), and the connectors 132. As a result, the conductive features 124a can provide an electrical connection between the semiconductor die 114 and one or more external devices (not shown, such as a memory device (e.g., DRAM)) via this electrical path. In some embodiments, each of the conductive features 122b (i.e., the island layers) covered by the capping layer 126a corresponds to and spaced apart from the underlying semiconductor die 114. For example, the conductive features 122b (i.e., the island layers) covered by the capping layers 126a are located on a central area of the surface 121a of the insulating base 121, so as to form a gap between the capping layers 126a and the semiconductor die 114 and a space between the interconnect structure 110 and the interposer structure 120.

Afterwards, an encapsulating layer 140 fills in the space between the interconnect structure 110 and the interposer structure 120, as shown in FIG. 1D, in accordance with some embodiments. The encapsulating layer 140 surrounds and protects the connectors 132. The encapsulating layer 140 also covers and surrounds the semiconductor die 114 and the underfill material 115, so as to fill the gap between the capping layers 126a and the semiconductor die 114. As a result, a portion of the encapsulating layer 140 is sandwiched by the conductive features 122b (i.e., the island layers) covered and surrounded by the capping layers 126a.

The encapsulating layer 140 may be made of a material that is the same as or different from that of the underfill material 115. As the cases of the encapsulating layer 140 made of a material that is the same as the underfill material 115, the underfill material 115 may be omitted from the structure shown in FIG. 1D. As the cases of the encapsulating layer 140 made of a material that is different form the underfill material 115, the encapsulating layer 140 may include a molding compound material, such as an epoxy-based resin. In some embodiments, a liquid encapsulating material (not shown) is applied over the semiconductor die 114. The liquid encapsulating material may flow into the space between the interconnect structure 110 and the interposer structure 120 and the gap between the capping layers 126a and the semiconductor die 114. A thermal process is then used to cure the liquid encapsulating material. As a result, the interposer structure 120 is separated from the semiconductor die 114 by the cured encapsulating material to form the encapsulating layer 140, and the connectors 132 are embedded in the encapsulating layer 140.

Figure 1E:
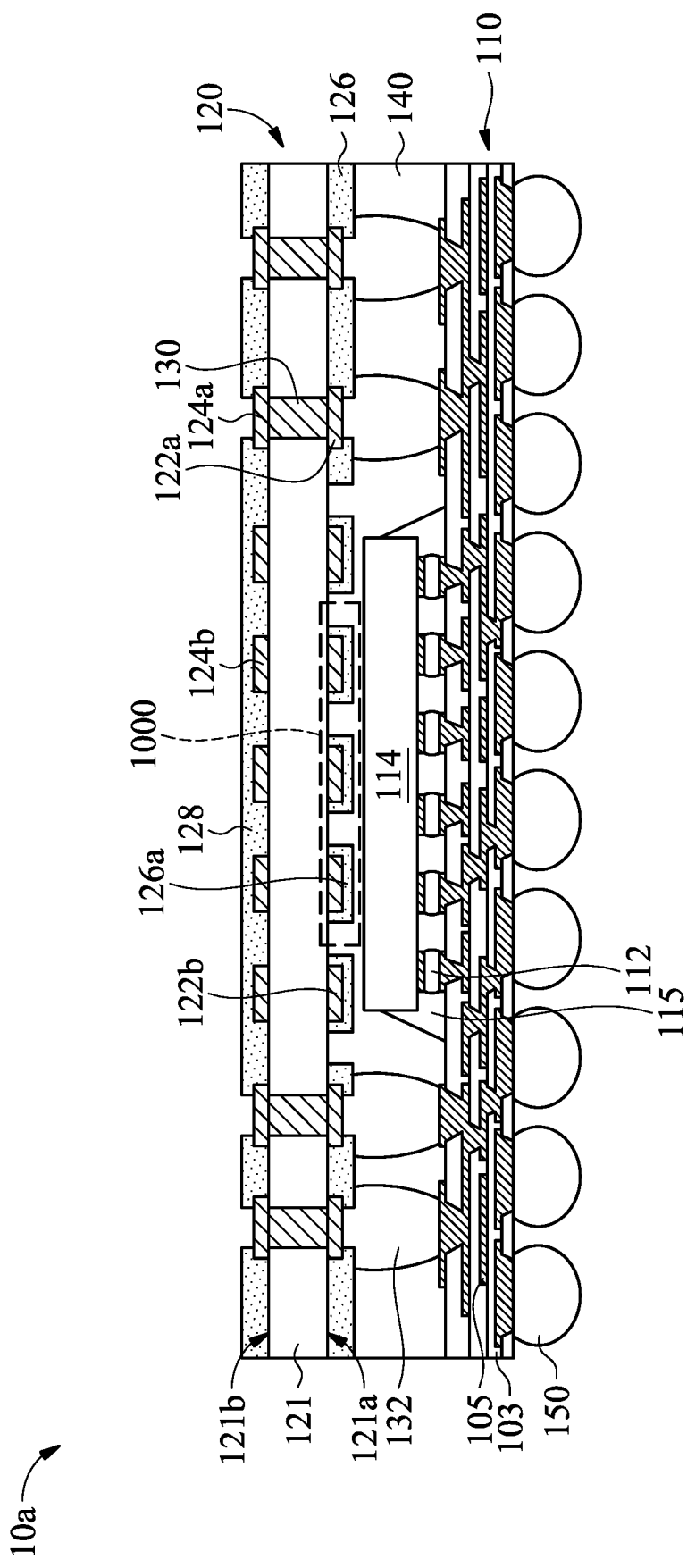

Afterwards, the carrier substrate 100 and the adhesive layer 102 are removed from the structure shown in FIG. 1D, and external connectors 150 are formed, as shown in FIG. 1E in accordance with some embodiments. In some embodiments, after the carrier substrate 100 and the adhesive layer 102 are removed to expose the bottom surface of the interconnect structure 110 (i.e., the surface of the interconnect structure 110 opposite the semiconductor die 114), the external connectors 150 are formed over the bottom surface of the interconnect structure 110. In some embodiments, the external connectors 150 are made of or include solder bumps such as tin-containing solder bumps. The tin-containing solder bumps may further include copper, silver, gold, aluminum, lead, one or more other suitable materials, or a combination thereof. In some embodiments, the tin-containing solder bump is lead free. Afterwards, a reflow process is then carried out to melt the solder bumps into solder balls to form the external connectors 150. In some other embodiments, optional UBM layers are formed over the exposed bottom surface of the interconnect structure 110 prior to the formation of the solder bumps. In some embodiments, a singulation process is then carried out to saw through the formed structure. As a result, multiple separate semiconductor packages 10a are formed. In FIG. 1E, one of the semiconductor packages 10a is shown.

It should be noted that during the formation of the encapsulating layer 140, if the interposer structure 120 has a substantially flat bottom surface (i.e., the surface face to the semiconductor die 114), the gap between the interposer structure 120 and the semiconductor die 114 is difficult to be filled with the liquid encapsulating material. Therefore, unwanted voids may form in the gap between the interposer structure 120 and the semiconductor die 114 and the reliability of the package structure is decreased. In order to avoid or reduce void formation, the conductive features 122b (i.e., the island layers) covered and surrounded by the capping layers 126a formed over the surface 121a of the insulating base 121 form a trench between the two adjacent capping layers 126a, and therefore the liquid encapsulating material flows smoothly and easily into the gap via those trenches between the adjacent capping layers 126a. As a result, such a void formation issue can be mitigated or eliminated, thereby increasing the reliability of the package structure.

Figure 3A:
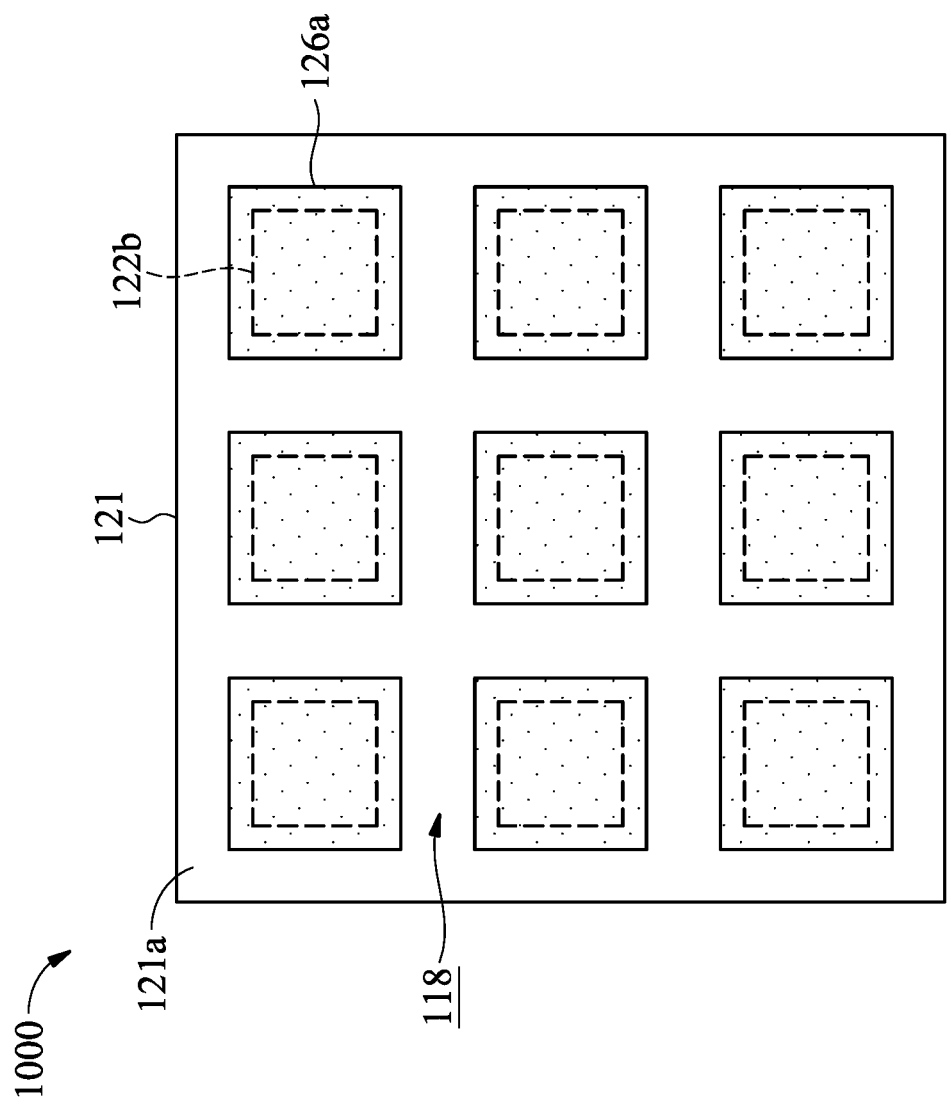
FIG. 3A is a plan view of the region 1000 in FIG. 1E, in accordance with some embodiments.

Referring to FIG. 3A, which shows a plan view of the region 1000 in FIG. 1E, in accordance with some embodiments. In FIG. 3A, a partially arrangement of the conductive features 122b (i.e., the island layers) covered and surrounded by the capping layers 126a is illustrated. In some embodiments, the top views of those conductive features 122b have a square shape, and those conductive features 122b are regularly arranged in a matrix over the surface 121a of the insulating base 121, so as to form trenches 118 adjacent to the conductive features 122b that are respectively covered and surrounded by a capping layer 126a. The trench 118 provides a space to allow the subsequent encapsulating layer 140 formed therein, so that a portion of the encapsulating layer 140 is sandwiched by the conductive features 122b (which are covered and surrounded by the capping layers 126a), as shown in FIG. 1E.

However, as one having ordinary skill in the art will recognize, the arrangement, the shape, and the number of the conductive features 122b described above are merely exemplary and are not meant to limit the current embodiments. The shape and the number of the conductive features 122b can be varied or modified in some other embodiments. For example, the conductive features 122b may have a circular, triangular, or rectangular shape, as viewed from a top-view perspective, and the number of the conductive features 122b may be more or less than that shown in FIG. 3A. Moreover, those conductive features 122b also can be irregularly arranged in some other embodiments.

Moreover, although the semiconductor package 10a shown in FIG. 1E includes capping layers 126a separated from each other and from the passivation layer 126, embodiments of the disclosure are not limited thereto. Many variations and/or modifications can be made to embodiments of the disclosure.

Figures 1, 1E:
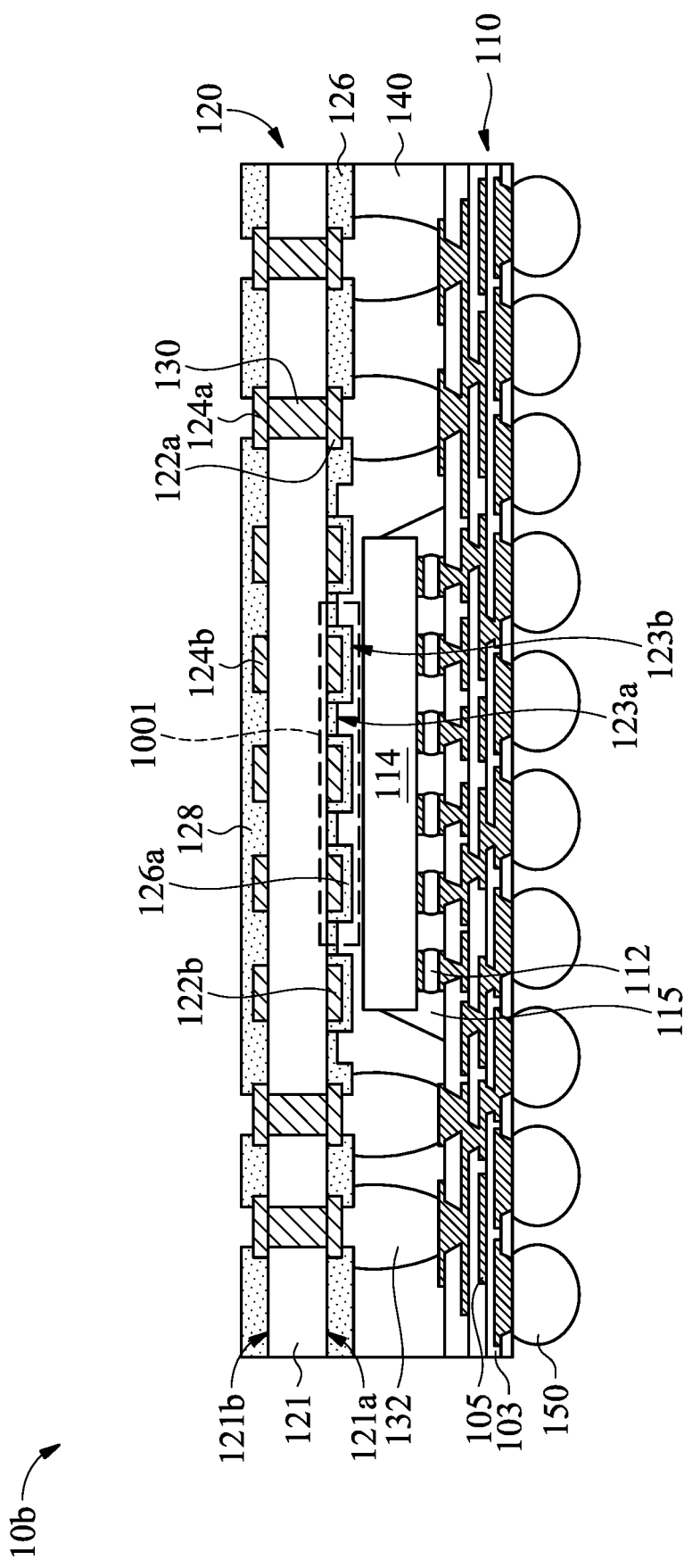

FIG. 1E-1 shows a cross-sectional representation of a semiconductor package 10b, in accordance with some embodiments. The semiconductor package 10b is similar to the semiconductor package 10a shown in FIG. 1E, except that the passivation layer 126 are extended to the surface 121a of the insulating base 121 that is uncovered by the conductive features 122b and the capping layers 126a. Therefore, portions of the passivation layer 126 are in direct contact with the of capping layers 126a, so that the trenches formed between the conductive features 122b (which are covered by the capping layers 126) have a bottom formed of the portions of the passivation layer 126. In some embodiments, the top surfaces 123a of the portions of the passivation layer 126 are lower than the top surfaces 123b of the capping layers 126a as measured from the surface 121a of the insulating base 121. In some other embodiments, the passivation layer 126 and the capping layers 126a are formed of a same layer (such as an insulating material layer), so that there is no interface between the passivation layer 126 and each of the capping layers 126a. Methods and materials used to form the semiconductor package 10b in FIG. 1E-1 may be the same as, or similar to those used to form the semiconductor package 10a and are not repeated herein.

Figure 3B:
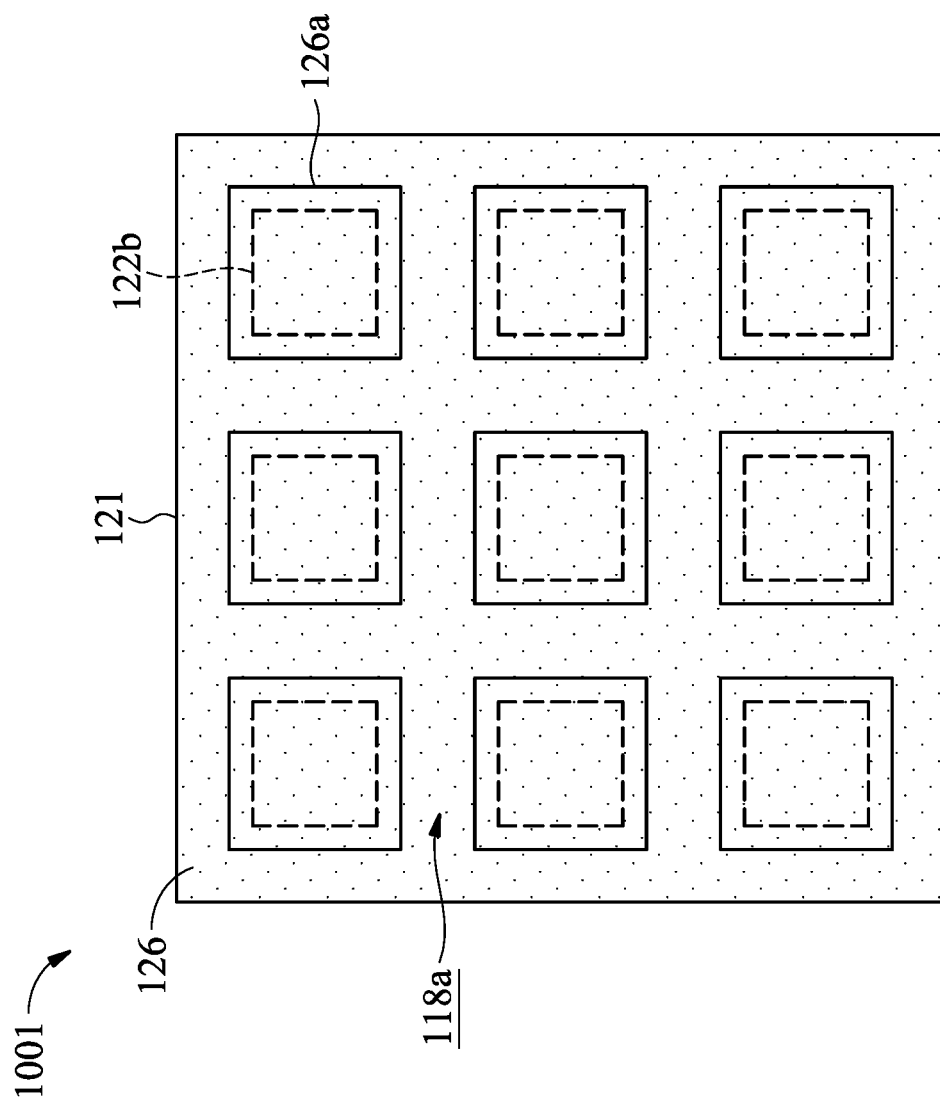
FIG. 3B is a plan view of the region 1001 in FIG. 1E-1, in accordance with some embodiments.

Referring to FIG. 3B, which shows a plan view of the region 1001 in FIG. 1E-1, in accordance with some embodiments. In FIG. 3B, a partially arrangement of the conductive features 122b (i.e., the island layers) covered and surrounded by the capping layers 126a is illustrated. Similar to FIG. 3A, the top views of those conductive features 122b have a square shape, and those conductive features 122b are regularly arranged in a matrix over the surface 121a of the insulating base 121. Unlike the trenches 118 shown in FIG. 3A, trenches 118a adjacent to the conductive features 122b (which are respectively covered and surrounded by a capping layer 126a) have a bottom formed of the passivation layer 126. The trench 118a also provides a space to allow the subsequent encapsulating layer 140 formed therein, so that a portion of the encapsulating layer 140 is sandwiched by the conductive features 122b (which are covered and surrounded by the capping layers 126a), as shown in FIG. 1E-1.

However, as one having ordinary skill in the art will recognize, the arrangement, the shape, and the number of the conductive features 122b described above are merely exemplary and are not meant to limit the current embodiments. The shape and the number of the conductive features 122b can be varied or modified in some other embodiments. For example, the conductive features 122b may have a circular, triangular, or rectangular shape, as viewed from a top-view perspective, and the number of the conductive features 122b may be more or less than that shown in FIG. 3B. Moreover, those conductive features 122b also can be irregularly arranged in some other embodiments.

Figures 1, 1E, 2:
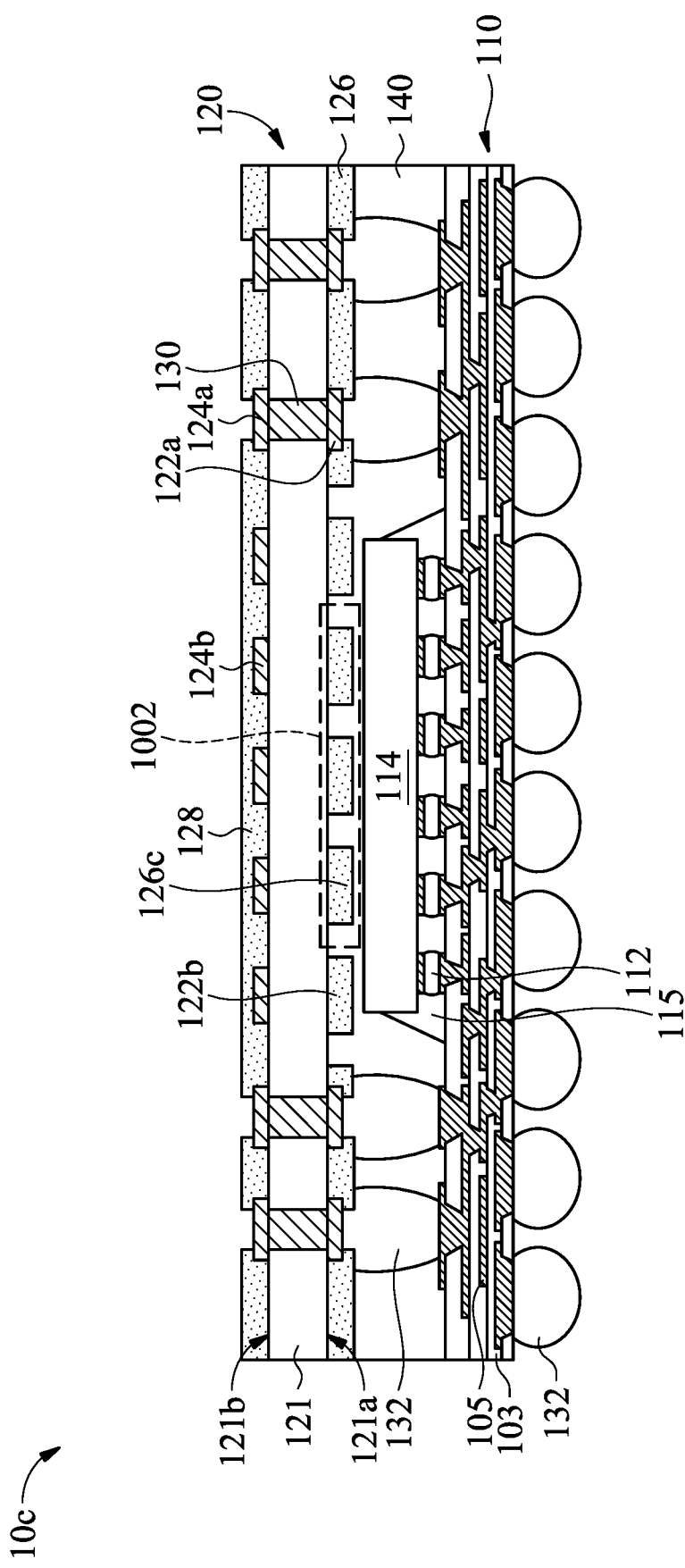

FIG. 1E-2 shows a cross-sectional representation of a semiconductor package 10c, in accordance with some embodiments. The semiconductor package 10c is similar to the semiconductor package 10a shown in FIG. 1E, except that there are not conductive features 122b and capping layers 126a formed over the surface 121a of the insulating base 121 of the interposer structure 120. In some embodiments, those structures including the conductive features 122b and capping layers 126a are replaced by insulating island layers 126c, as shown in FIG. 1E-2. In some embodiments, the insulating island layers 126c and the passivation layer 126 are made of a same layer, such as an insulating material layer. Moreover, the insulating island layers 126c are spaced apart from and surrounded by the passivation layer 126. Methods and materials used to form the semiconductor package 10b in FIG. 1E-1 may be the same as, or similar to those used to form the semiconductor package 10a and are not repeated herein.

Figure 3C:
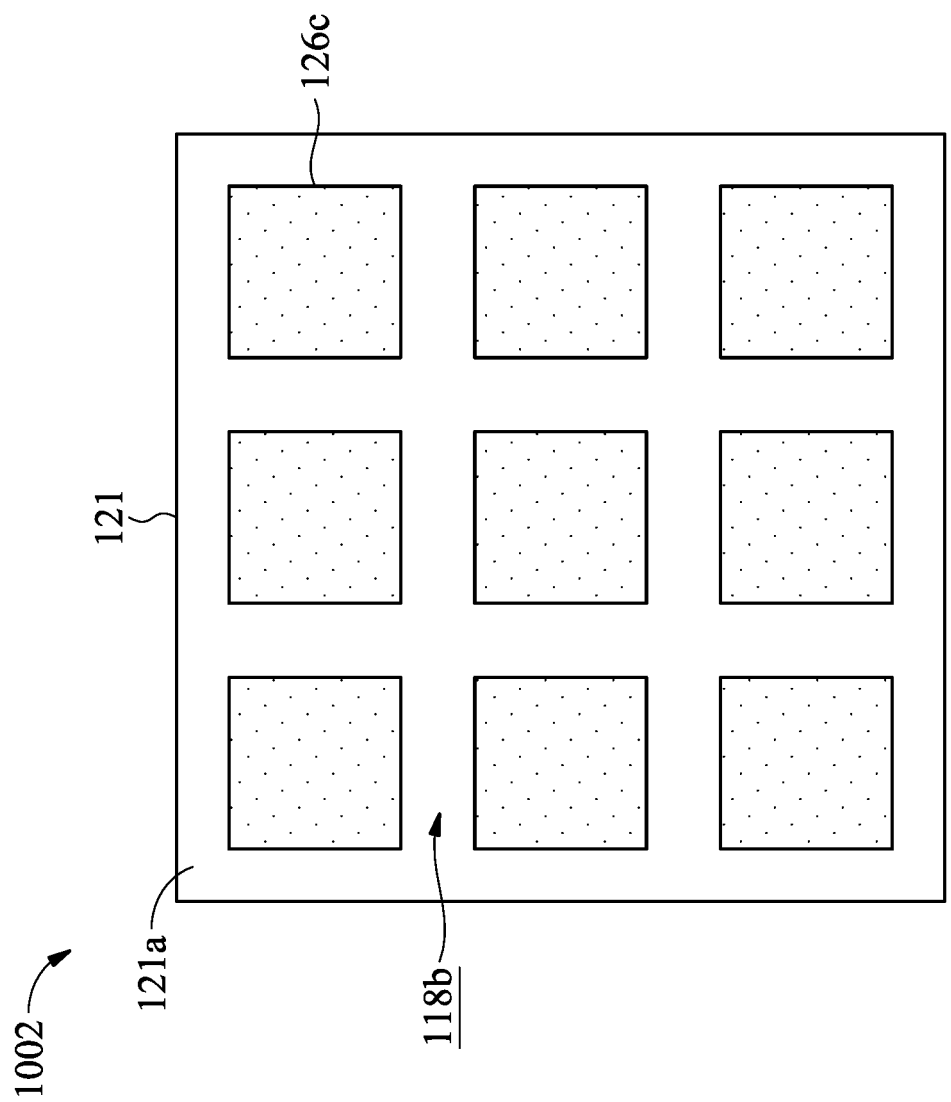
FIG. 3C is a plan view of the region 1002 in FIG. 1E-2, in accordance with some embodiments.

Referring to FIG. 3C, which shows a plan view of the region 1002 in FIG. 1E-2, in accordance with some embodiments. In FIG. 3C, a partially arrangement of the insulating island layers 126c is illustrated. Similar to FIG. 3A, the top views of those insulating island layers 126c have a square shape, and those insulating island layers 126c are regularly arranged in a matrix over the surface 121a of the insulating base 121. Moreover, like the trenches 118 shown in FIG. 3A, trenches 118b are formed adjacent to the insulating island layers 126c. The trench 118b also provides a space to allow the subsequent encapsulating layer 140 formed therein, so that a portion of the encapsulating layer 140 is sandwiched by the insulating island layers 126c, as shown in FIG. 1E-2.

However, as one having ordinary skill in the art will recognize, the arrangement, the shape, and the number of the insulating island layers 126c described above are merely exemplary and are not meant to limit the current embodiments. The shape and the number of the insulating island layers 126c can be varied or modified in some other embodiments. For example, the insulating island layers 126c may have a circular, triangular, or rectangular shape, as viewed from a top-view perspective, and the number of the insulating island layers 126c may be more or less than that shown in FIG. 3C. Moreover, those insulating island layers 126c also can be irregularly arranged in some other embodiments.

Although the semiconductor packages 10a, 10b, and 10c respectively shown in FIGS. 1E, 1E-1, and 1E-2 include the interposer structure 120 with through-vias 130 therein, embodiments of the disclosure are not limited thereto. Many variations and/or modifications can be made to embodiments of the disclosure.

Figure 4A:
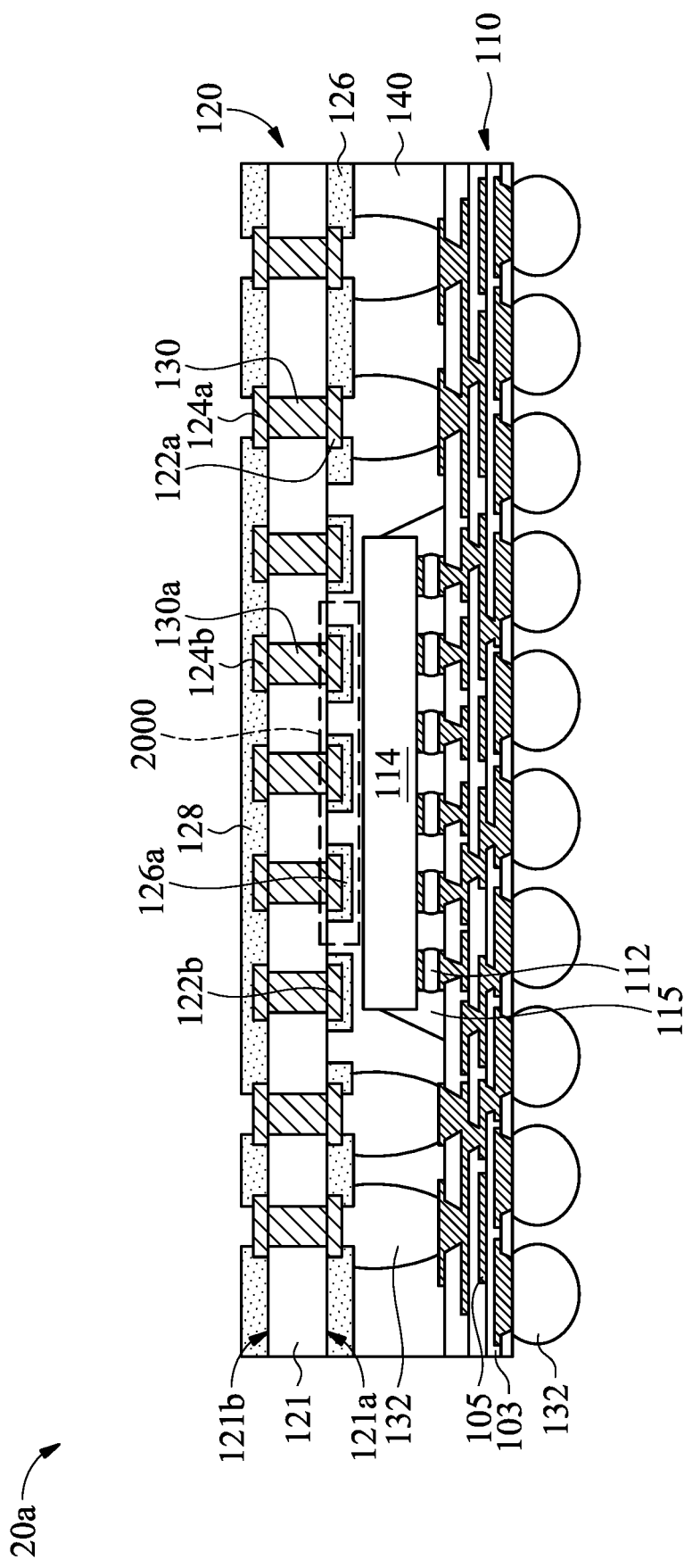
FIG. 4A shows a cross-sectional representation of a semiconductor package, in accordance with some embodiments.

FIG. 4A shows a cross-sectional representation of a semiconductor package 20a, in accordance with some embodiments. The semiconductor package 20a is similar to the semiconductor package 10a shown in FIG. 1E, except that the interposer structure 120 further includes dummy through-vias 130a formed in the insulating base 121 and respectively corresponding to the conductive features 122b (i.e., the island layers) and the conductive features 124b. In some embodiments, the dummy through-vias 130a are in contact with the conductive features 122b and 124b. In some other embodiments, the dummy through-vias 130a are not in contact with the conductive features 124b if the conductive features 124b serve as the trace or routing layers. In some embodiments, the method and material used to form the dummy through-vias 130a in FIG. 4A may be the same as, or similar to those used to form the through-vias 130 and are not repeated herein. In some other embodiments, the dummy through-vias 130a are made be made of a polymer material (such as resin) or an insulating material (such as ceramic). Methods and materials used to form the semiconductor package 20a in FIG. 4A may be the same as, or similar to those used to form the semiconductor package 10a and are not repeated herein.

It should be noted that the warpage of the interposer structure 120 may occur when the interposer structure 120 is thin. If the interposer structure 120 is warped or bent toward to the semiconductor die 114, the gap between the interposer structure 120 and the semiconductor die may not be filled with the liquid molding compound material. Therefore, unwanted voids may form in the gap. Moreover, the warped interposer structure is also detrimental to the package warpage control. Therefore, the reliability of the package structure is decreased and the processes for handling and manufacturing the package structure become more difficult. However, the use of the dummy through-vias 130a can effectively enhance the rigidity of the interposer structure 120, thereby preventing the interposer structure 120 from being warped. As a result, the reliability of the package structure can be increased and better processes control for handling and manufacturing the package structure can be obtained.

Figure 4B:
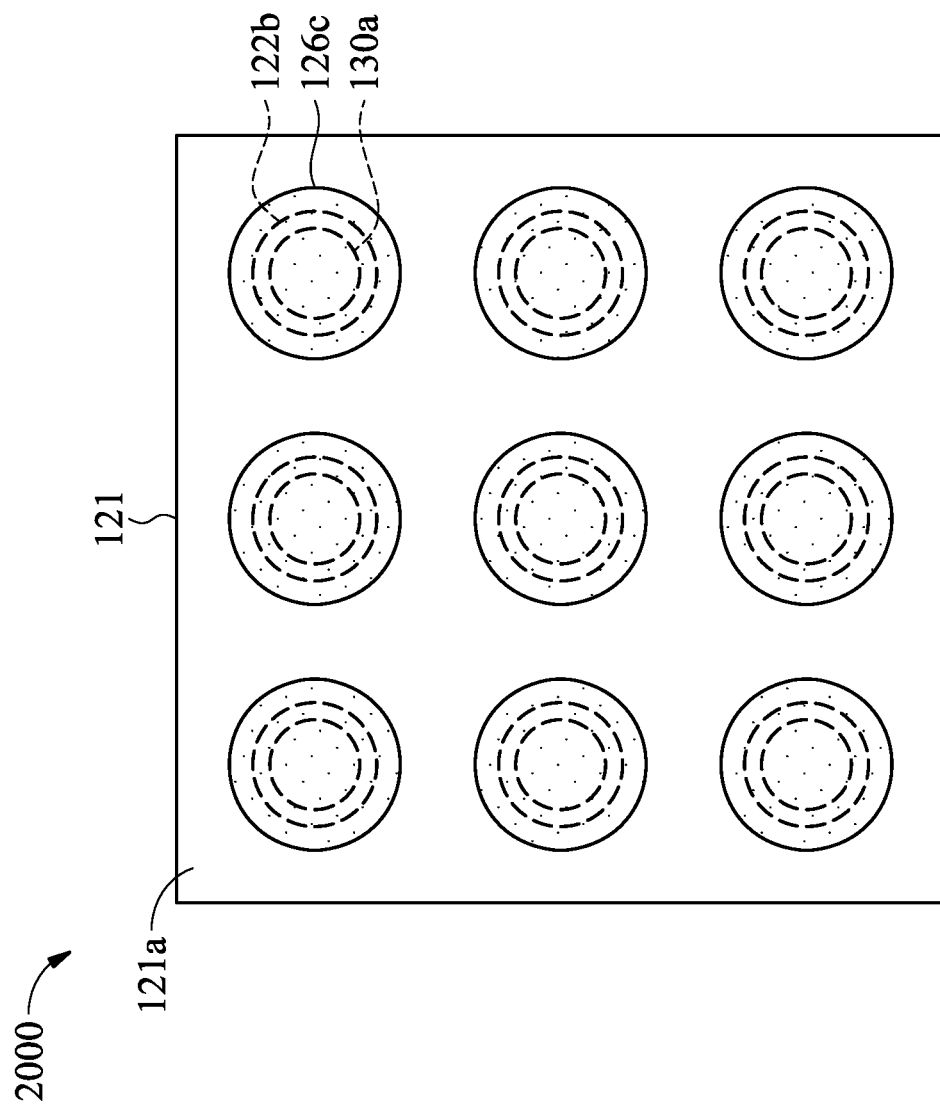
FIG. 4B is a plan view of the region 2000 in FIG. 4A, in accordance with some embodiments.

Referring to FIG. 4B, which shows a plan view of the region 2000 in FIG. 4A, in accordance with some embodiments. In FIG. 4B, a partially arrangement of the conductive features 122b (i.e., the island layers) covered and surrounded by the capping layers 126a and having dummy through-vias 130a formed thereon is illustrated. In some embodiments, the top views of those conductive features 122b and the dummy through-vias 130a have a circular shape, and the dummy through-via 130a has a diameter less than that of the conductive feature 122b. For example, the diameter of the dummy through-via is in a range from about 5 µm to about 300 µm. Similar to the arrangement shown in FIG. 3A, those conductive features 122b and the dummy through-vias 130a are regularly arranged in a matrix.

However, as one having ordinary skill in the art will recognize, the arrangement, the shape, and the number of the conductive features 122b and those of the dummy through-vias 130a described above are merely exemplary and are not meant to limit the current embodiments. The shape and the number of both the conductive features 122b and the dummy through-vias 130a can be varied or modified in some other embodiments. For example, they may have a square, triangular, or rectangular shape, as viewed from a top-view perspective. Moreover, the number of them may be more or less than that shown in FIG. 4B, so as to tuning the rigidity of the interposer structure 120 via the dummy through-vias 130a. Moreover, those conductive features 122b and those dummy through-vias 130a also can be irregularly arranged in some other embodiments.

Figure 5A:
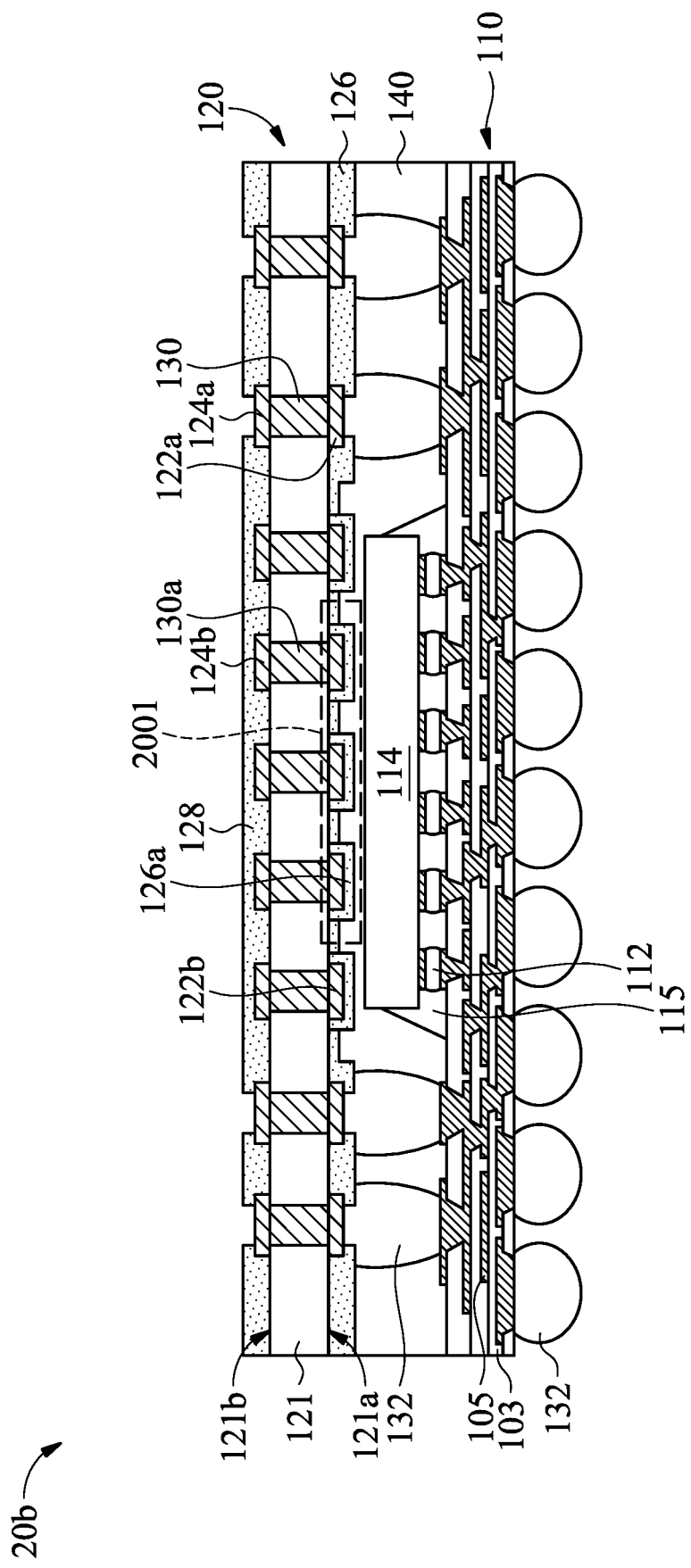
FIG. 5A shows a cross-sectional representation of a semiconductor package, in accordance with some embodiments.

FIG. 5A shows a cross-sectional representation of a semiconductor package 20b, in accordance with some embodiments. The semiconductor package 20b is similar to the semiconductor package 10b shown in FIG. 1E-1, except that the interposer structure 120 further includes dummy through-vias 130a formed in the insulating base 121 and respectively corresponding to the conductive features 122b (i.e., the island layers) and the conductive features 124b. In some embodiments, the dummy through-vias 130a are in contact with the conductive features 122b and 124b. In some other embodiments, the dummy through-vias 130a are not in contact with the conductive features 124b if the conductive features 124b serve as the trace or routing layers. In some embodiments, the method and material used to form the dummy through-vias 130a in FIG. 5A may be the same as, or similar to those used to form the dummy through-vias 130a in FIG. 4A and are not repeated herein. Methods and materials used to form the semiconductor package 20b in FIG. 5A may be the same as, or similar to those used to form the semiconductor package 10a or the semiconductor package 20a and are not repeated herein.

Figure 5B:
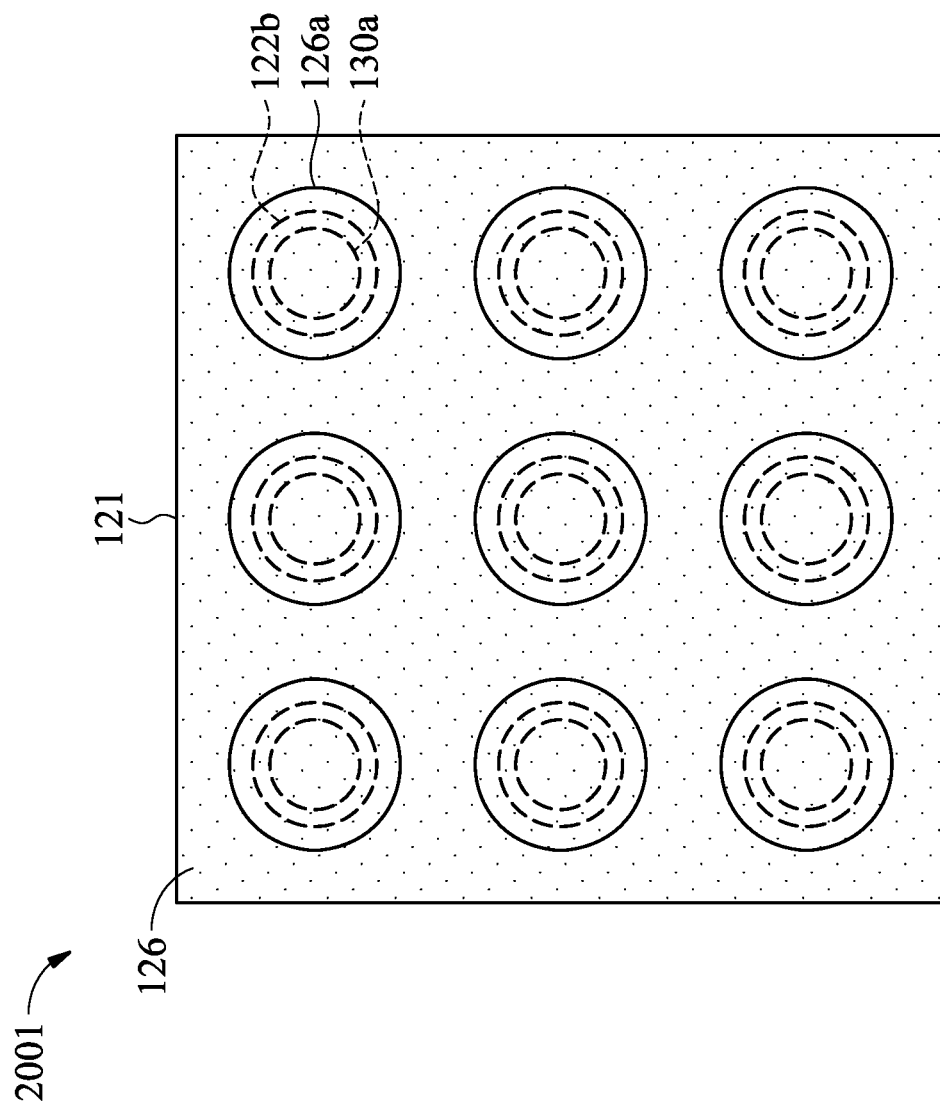
FIG. 5B is a plan view of the region 2001 in FIG. 5A, in accordance with some embodiments.

Referring to FIG. 5B, which shows a plan view of the region 2001 in FIG. 5A, in accordance with some embodiments. In FIG. 5B, a partially arrangement of the conductive features 122b (i.e., the island layers) covered and surrounded by the capping layers 126a and having dummy through-vias 130a formed thereon is illustrated. Similar to FIG. 4B, the top views of those conductive features 122b and the dummy through-vias 130a have a circular shape, and the dummy through-via 130a has a diameter less than that of the conductive feature 122b. For example, the diameter of the dummy through-via is in a range from about 5 µm to about 300 µm. Similar to the arrangement shown in FIG. 4B, those conductive features 122b and the dummy through-vias 130a are regularly arranged in a matrix.

However, as one having ordinary skill in the art will recognize, the arrangement, the shape, and the number of the conductive features 122b and those of the dummy through-vias 130a described above are merely exemplary and are not meant to limit the current embodiments. The shape and the number of both the conductive features 122b and the dummy through-vias 130a can be varied or modified in some other embodiments. For example, they may have a square, triangular, or rectangular shape, as viewed from a top-view perspective. Moreover, the number of them may be more or less than that shown in FIG. 5B. Moreover, those conductive features 122b and those dummy through-vias 130a also can be irregularly arranged in some other embodiments.

Figure 6A:
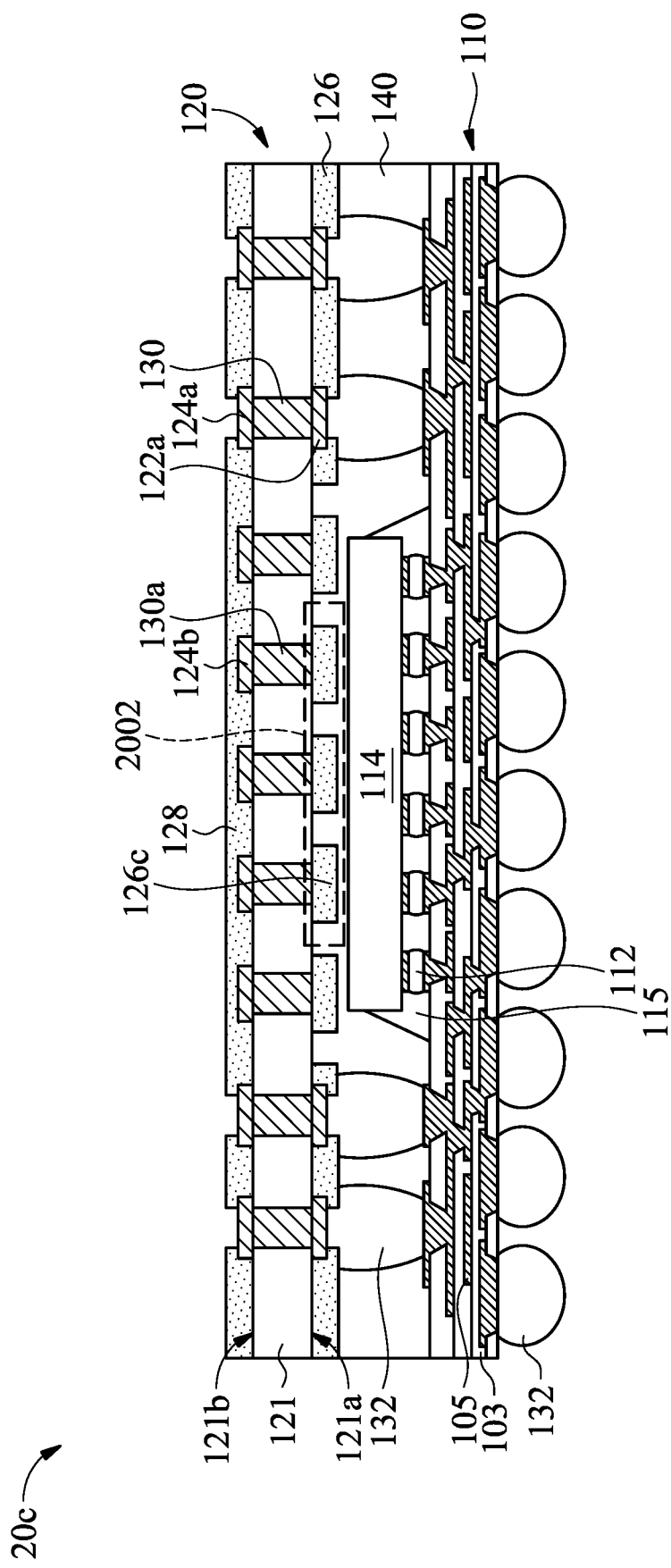
FIG. 6A shows a cross-sectional representation of a semiconductor package, in accordance with some embodiments.

FIG. 6A shows a cross-sectional representation of a semiconductor package 20c, in accordance with some embodiments. The semiconductor package 20c is similar to the semiconductor package 10c shown in FIG. 1E-2, except that the interposer structure 120 further includes dummy through-vias 130a formed in the insulating base 121 and respectively corresponding to the insulating island layers 126c and the conductive features 124b. In some embodiments, the dummy through-vias 130a are in contact with the conductive features 122b and 124b. In some other embodiments, the dummy through-vias 130a are not in contact with the conductive features 124b if the conductive features 124b serve as the trace or routing layers. In some embodiments, the method and material used to form the dummy through-vias 130a in FIG. 6A may be the same as, or similar to those used to form the dummy through-vias 130a in FIG. 4A and are not repeated herein. Methods and materials used to form the semiconductor package 20c in FIG. 6A may be the same as, or similar to those used to form the semiconductor package 10a or the semiconductor package 20a and are not repeated herein.

Figure 6B:
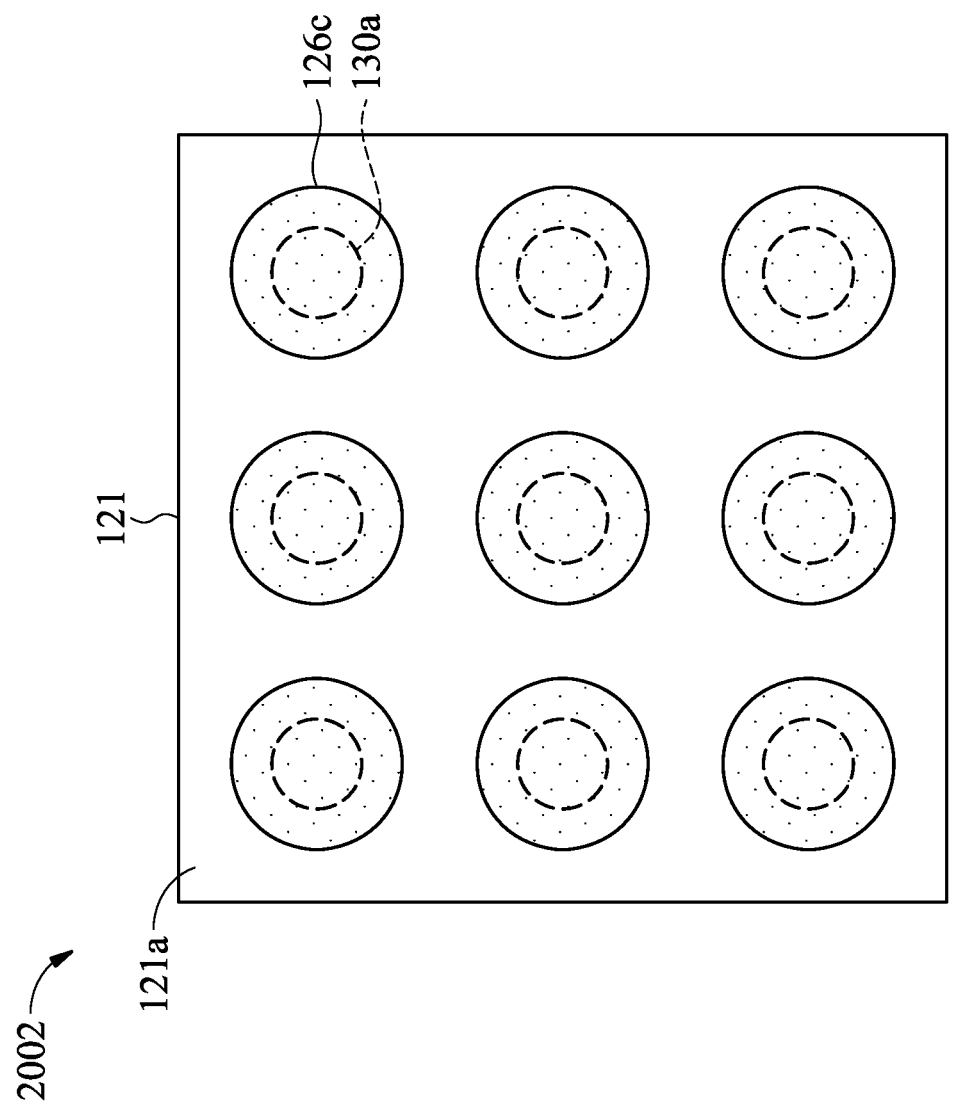
FIG. 6B is a plan view of the region 2005 in FIG. 6A, in accordance with some embodiments.

Referring to FIG. 6B, which shows a plan view of the region 2002 in FIG. 6A, in accordance with some embodiments. In FIG. 6B, a partially arrangement of the insulating island layers 126c having dummy through-vias 130a formed thereon is illustrated. Similar to FIG. 4B, the top views of those insulating island layers 126c and the dummy through-vias 130a have a circular shape, and the dummy through-via 130a has a diameter less than that of the insulating island layers 126c. For example, the diameter of the dummy through-via is in a range from about 5 µm to about 300 µm. Similar to the arrangement shown in FIG. 4B, those insulating island layers 126c and the dummy through-vias 130a are regularly arranged in a matrix.

However, as one having ordinary skill in the art will recognize, the arrangement, the shape, and the number of the insulating island layers 126c and those of the dummy through-vias 130a described above are merely exemplary and are not meant to limit the current embodiments. The shape and the number of both the insulating island layers 126c and the dummy through-vias 130a can be varied or modified in some other embodiments. For example, they may have a square, triangular, or rectangular shape, as viewed from a top-view perspective. Moreover, the number of them may be more or less than that shown in FIG. 6B. Moreover, those insulating island layers 126c and those dummy through-vias 130a also can be irregularly arranged in some other embodiments.

Figure 7A:
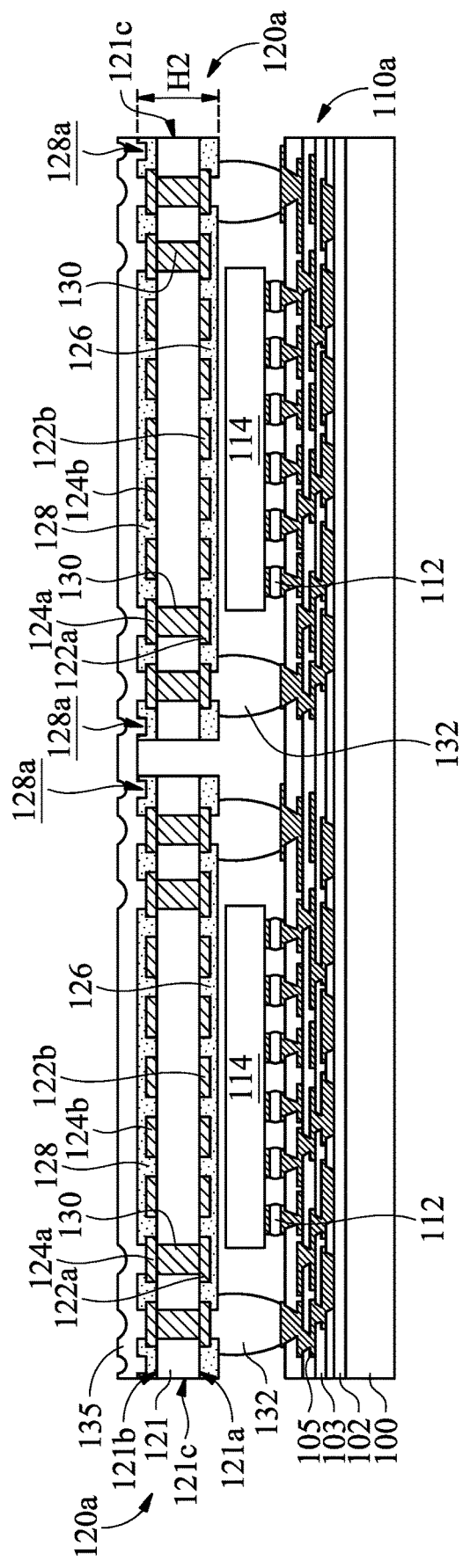
FIGS. 7A to 7D show cross-sectional representations of various stages of forming a semiconductor package, in accordance with some embodiments.

Many variations and/or modifications can be made to embodiments of the disclosure. FIGS. 7A to 7D show cross-sectional representations of various stages of forming a semiconductor package 30a, in accordance with some embodiments. A structure similar to the structure shown in FIG. 1C is provided or formed, as shown in FIG. 7A in accordance with some embodiments. Unlike to FIG. 1C, FIG. 7A illustrates two adjacent semiconductor dies 114 formed over the interconnect structure 110a and respectively capped by an interposer structure 120a, and an adhesive layer 135 is formed over the interposer structures 120a. In some embodiments, the adhesive layer 135 is a release film such as a light-to-heat-conversion (LTHC) film. In some other embodiments, the adhesive layer 125 is a composite film, such as a silicon type or acrylic type resin. However, any other suitable material may be utilized, such as adhesive tape or glue. Moreover, unlike the structure shown in FIG. 1C, there is not an underfill material 115 filling the gap between the interconnect structure 110a and each semiconductor die 114. However, in some other embodiments, there is an underfill material 115 (as shown in FIG. 1C) filling the gap between the interconnect structure 110a and each semiconductor die 114 if desired.

In some embodiments, the interposer structure 120a has a structure similar to the interposer structure 120 shown in FIG. 1C. Methods and materials used to form the interposer structure 120a may be the same as or similar to those used to form the interposer structure 120 shown in FIG. 1C and are not repeated herein. In some embodiments, the interposer structure 120a includes an insulating base 121 with conductive features 122a, 122b, 124a, and 124b and passivation layers 126 and 128 on opposite surfaces 121a and 121b of the insulating base 121, and through-vias 130 in the insulating base 121, as shown in FIG. 7A. In some other embodiments, one or more conductive features (such as trace layers or routing layers) are built within the insulating base 121. In some embodiments, the interposer structure 120a has a height H2 that is in a range from about 50 µm to about 900 µm. For example, the height H2 of the interposer structure 120a may be in a range from about 50 µm to about 300 µm.

In some embodiments, the conductive features 122a and 124a are used as pads that are arranged along one or more peripheral edges 121c of the insulating base 121 and respectively in contact with or electrically coupled to opposite ends of the through-vias 130. In some embodiments, the conductive features 122b and 124b serve as trace layers with desired circuit pattern. In some other embodiments, the conductive features 122b do not serve as trace layers, but serve as dummy pads with island-shaped and therefore are also referred to as island layers. In some embodiments, the conductive features 122b and 124b are surrounding by the conductive features 122a and 124a.

Passivation layers 126 and 128 are respectively formed over the opposite surfaces 121a and 121b of the insulating base 121, as shown in FIG. 7A in accordance with some embodiments. In some embodiments, the passivation layer 126 have multiple openings that partially expose each of the conductive features 122a and entirely covering all of the conductive features 122a.

Alternatively, the passivation layer 126 and the conductive features 122b have a configuration that is the same as that of the passivation layer 126 and the conductive features 122b in the interposer structure 120 shown in FIG. 1E or 1E-1, so that each of the conductive features 122b is covered and surrounded by a capping layer 126a. In some other embodiments, the conductive features 122b in the interposer structure 120a can be replaced by the insulating island layers 126c shown in FIG. 1E-2, so that those insulating island layers 126c are separated from and surrounded by the passivation layer 126.

In some embodiments, the passivation layer 128 is covered by the adhesive layer 135 and has multiple openings that partially expose each of the conductive features 124a and entirely covering all of the conductive features 122b. Moreover, the passivation layer 128 has a recess 128a extended along the peripheral edges 121c of the insulating base 121 to surround the conductive features 124a. In some embodiments, the recess 128a has a bottom formed of the passivation layer 128. In other words, the bottom surface of the recess 128a is between the top surface and the bottom surface of the passivation layer 128, as shown in FIG. 7A. In some other embodiments, the recess 128a extends through the passivation layer 128 to expose the second surface 121b of the insulating base 121. In some embodiments, the recess 128a is formed using a laser drilling process or another suitable a patterning process (such as lithography and etching processes).

Since the passivation layer 128 is covered by the adhesive layer 135, those openings that partially expose each of the conductive features 124a and the recess 128a are filled with the adhesive layer 135, as shown in FIG. 7A. The adhesive layer 135 is employed to fix the separate interposer structure 120a and protect the exposed conductive features 124a (i.e., pads for electrically connecting external devices (not shown, such as a memory device (e.g., DRAM)).

In some embodiments, the interposer structure 120a further includes dummy through-vias 130a (as shown in FIG. 4A, 5A, or 6A) formed in the insulating base 121, so as to enhance the rigidity of the interposer structure 120a.

Figure 7B:
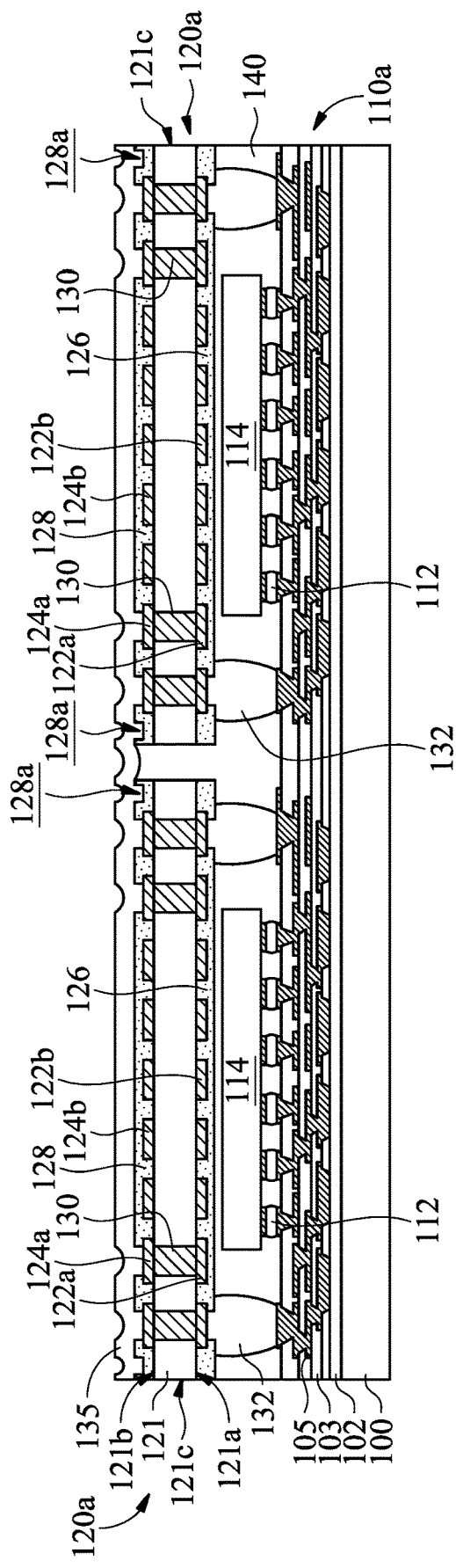

Afterwards, an encapsulating layer 140 fills in the space between the interconnect structure 110a and the interposer structure 120a, as shown in FIG. 7B, in accordance with some embodiments. The encapsulating layer 140 surrounds and protects the connectors 132. The encapsulating layer 140 also covers and surrounds the semiconductor dies 114, so as to fill the gap between the capping layers 126 and the semiconductor die 114 and the gap between the interconnect structure 110a and each of semiconductor dies 114. As described above, in the embodiments that the passivation layer 126 and the conductive features 122b have a configuration that is the same as that of the passivation layer 126 and the conductive features 122b in the interposer structure 120 shown in FIG. 1E or 1E-1, a portion of the encapsulating layer 140 is sandwiched by the conductive features 122b (i.e., the island layers) covered and surrounded by the capping layers 126a.

In some embodiments, a liquid encapsulating material (not shown) is applied over the semiconductor dies 114 and flows into the space between the interconnect structure 110a and the interposer structure 120a. A thermal process is then used to cure the liquid encapsulating material to form the encapsulating layer 140.

It should be noted that although the passivation layer 128 is covered by the adhesive layer 135 (i.e., the protective layer), the liquid encapsulating material may flow between the top surface of the passivation layer 128 and the adhesive layer 135 during the formation of the encapsulating layer 140. As a result, the liquid encapsulating material may creep across the top surface of the passivation layer 128 to contaminate pads (i.e., the conductive features 124a) that are exposed from the passivation layer 128. However, the recess 128a in the passivation layer 128 of the interposer structure 120a can serve a moat for receiving the creeping liquid encapsulating material, thereby effectively preventing the pads (i.e., the conductive features 124a) from being contaminated by the creep of liquid encapsulating material. In some embodiments, the recess 128a also provides more contact area for enhancing the filling of the adhesive layer 135. Therefore, the creep of liquid encapsulating material can be mitigated.

Figure 7C:
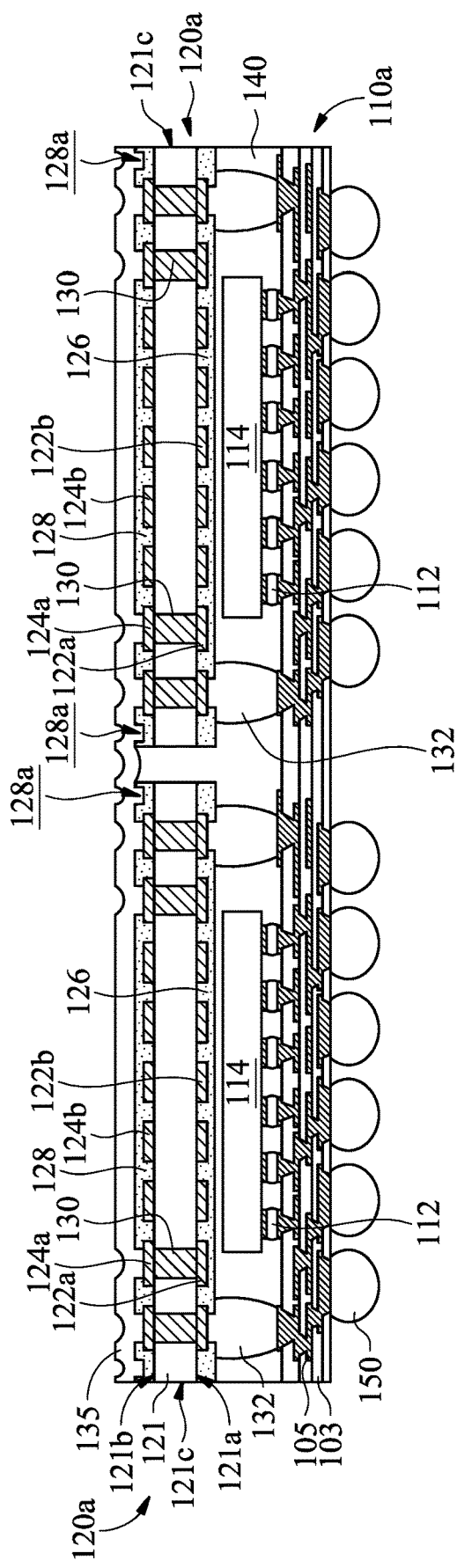

Afterwards, the adhesive layer 315, the carrier substrate 100 and the adhesive layer 102 are removed from the structure shown in FIG. 7B, and external connectors 150 are formed, as shown in FIG. 7C in accordance with some embodiments. In some embodiments, after the carrier substrate 100 and the adhesive layer 102 are removed to expose the bottom surface of the interconnect structure 110a (i.e., the surface of the interconnect structure 110a opposite the semiconductor die 114), the external connectors 150 are formed over the bottom surface of the interconnect structure 110a. In some other embodiments, optional UBM layers are formed over the exposed bottom surface of the interconnect structure 110a prior to the formation of the solder bumps.

Figure 7D:
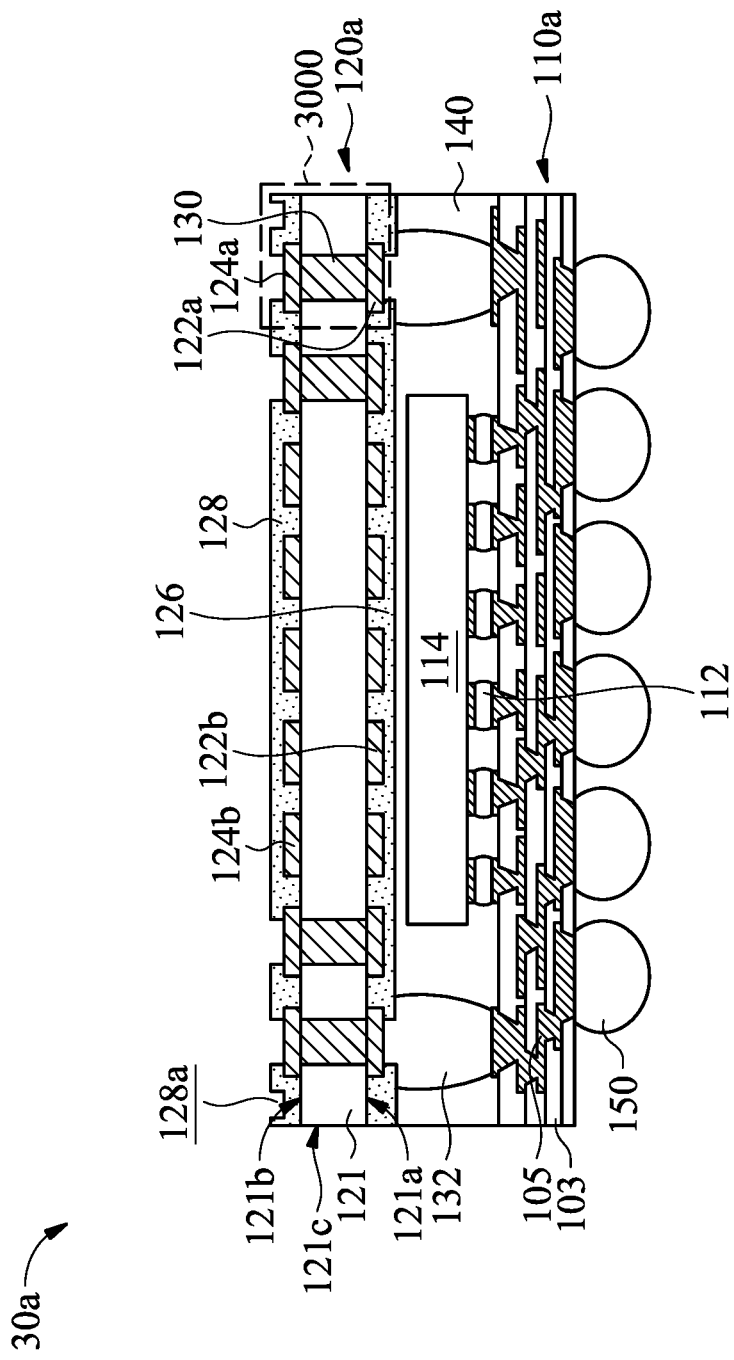

Afterwards, a singulation process is carried out to saw through the formed structure shown in FIG. 7C, in accordance with some embodiments. As a result, multiple separate semiconductor packages 30a are formed. In FIG. 7D, one of the semiconductor packages 30a is shown.

Figure 8A:
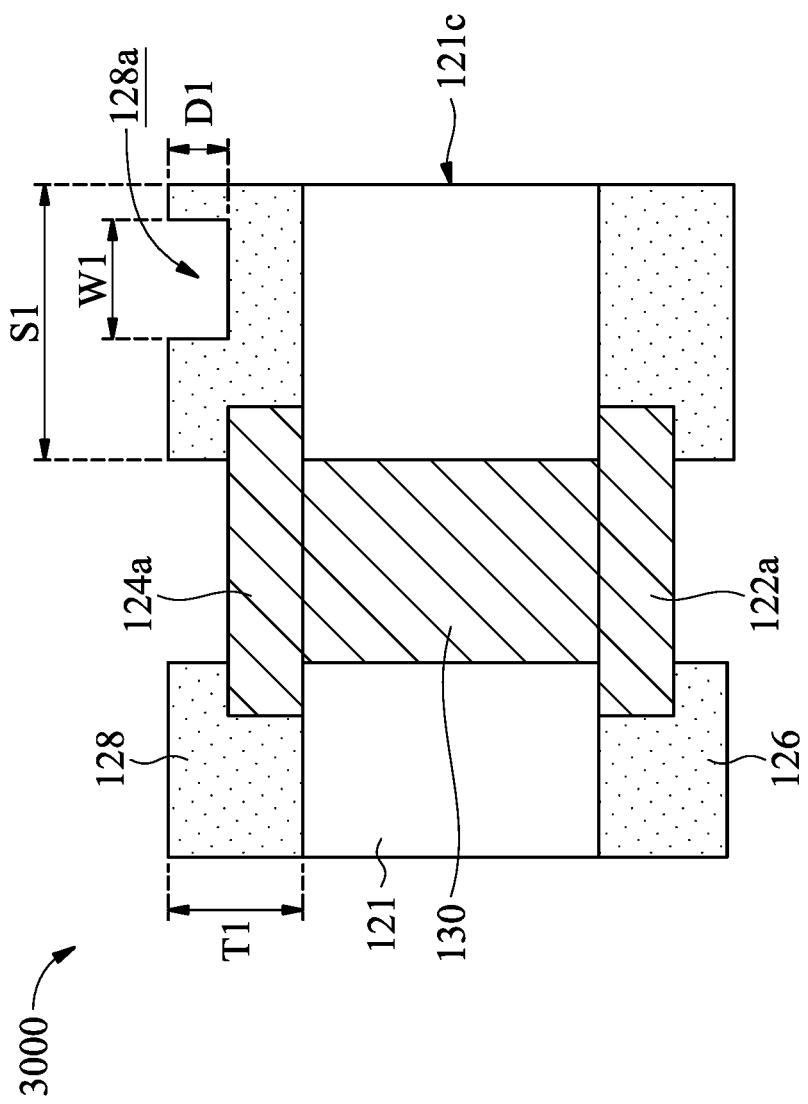
FIG. 8A is an enlarged cross-sectional representation of the region 3000 in FIG. 7D, in accordance with some embodiments.
Figure 8C:
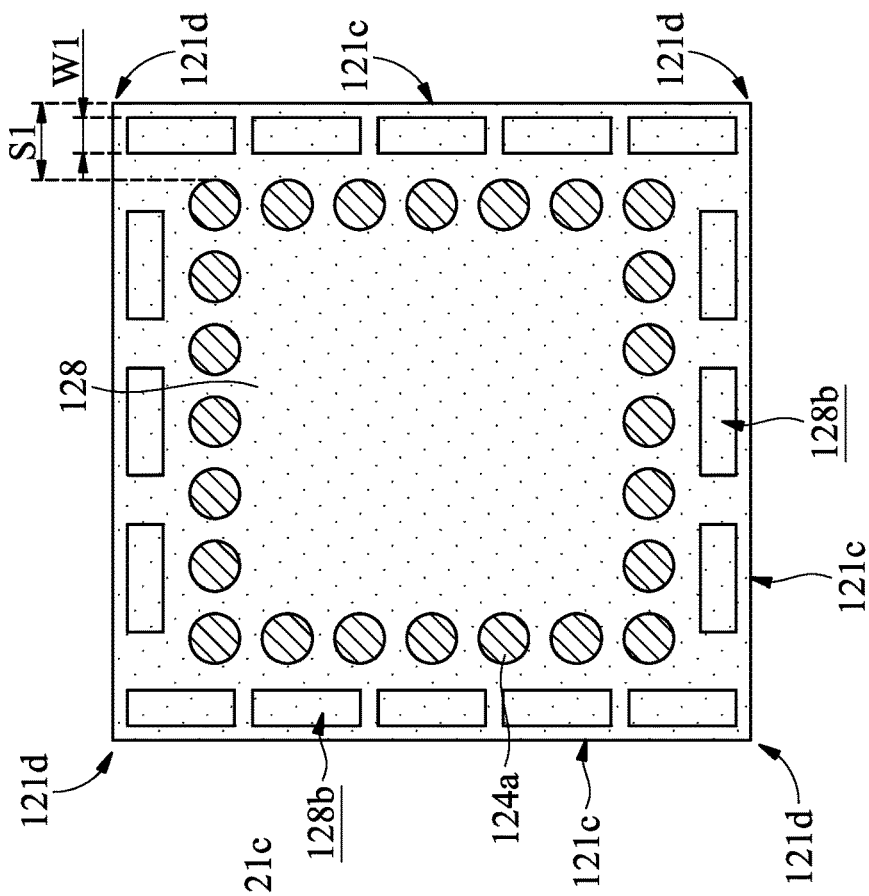
FIG. 8C is a plan view of an interposer structure having recesses, in accordance with some embodiments.
Figure 8B:
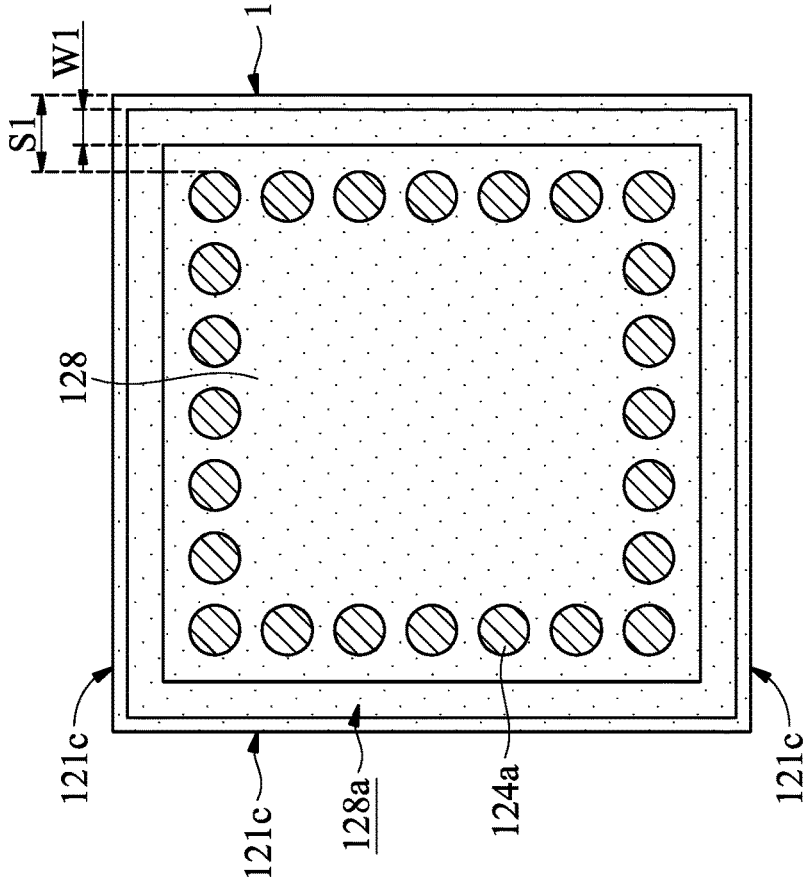
FIG. 8B is a plan view of an interposer structure having the recess shown in FIG. 8A, in accordance with some embodiments.

Referring to FIGS. 8A and 8B, in which FIG. 8A is an enlarged cross-sectional representation of the region 3000 in FIG. 7D, in accordance with some embodiments. FIG. 8B is a plan view of the interposer structure 120a having the recess 128a shown in FIG. 8A, in accordance with some embodiments. The ring-shaped recess 128a surrounds the conductive features 124a and is laterally spaced a distance apart from the peripheral edges 121c of the insulating base 121, as shown in FIG. 8A and/or FIG. 8B in accordance with some embodiments. As shown in FIG. 8A and/or FIG. 8B, the recess 128a has a width W1 and a depth D1. Moreover, the opening formed in the passivation layer 128 to expose the conductive feature 124a (e.g., the pad) has a sidewall that is laterally spaced a distance S1 apart from one of the peripheral edges 121c (the one closest to the sidewall of the opening), and the passivation layer 128 has a thickness T1. In some embodiments, the width W1 of the recess 128a is in a range from about 5 μm to about 500 μm and is less than the distance S1. In some embodiments, the thickness T1 of the passivation layer 128 is in a range from about 5 μm to about 50 μm and is greater than or equal to the depth D1 of the recess 128a.

Although the passivation layer 128 shown in FIG. 8B has a recess 128*a* with a top-view of a continuous ring-shaped configuration, embodiments of the disclosure are not limited thereto. Many variations and/or modifications can be made to embodiments of the disclosure.

FIG. 8C is a plan view of the interposer structure 120*a* having recesses 128*b*, in accordance with some embodiments. Similar to the recess 128*a* shown in FIG. 8B, each of the recesses 128*b* has a width W1 and a depth D1. Moreover, in some embodiments, the width W1 of the recess 128*b* is in a range from about 5 μm to about 500 μm and is less than the distance S1. Unlike the ring-shaped recess 128*a* shown in FIG. 8B, those recesses 128*b* has a top-view of rectangular configuration. Moreover, some of the recesses 128*b* (e.g., first recesses) are arranged at and extended along the peripheral edges 121*c* of the insulating base 121, and some of the recesses 128*b* (e.g., second recesses) are arranged at peripheral corners 121*d* of the insulating base 121 and adjacent to some of the first recesses, so as to form a discontinuous ring surrounding the conductive features 124*a*.

Although the interposer structure 120*a* shown in FIG. 8B includes a passivation layer 128 having a recess 128*a* that is laterally spaced a distance apart from the peripheral edges 121*c* of the insulating base 121, embodiments of the disclosure are not limited thereto. Many variations and/or modifications can be made to embodiments of the disclosure.

Figure 9A:
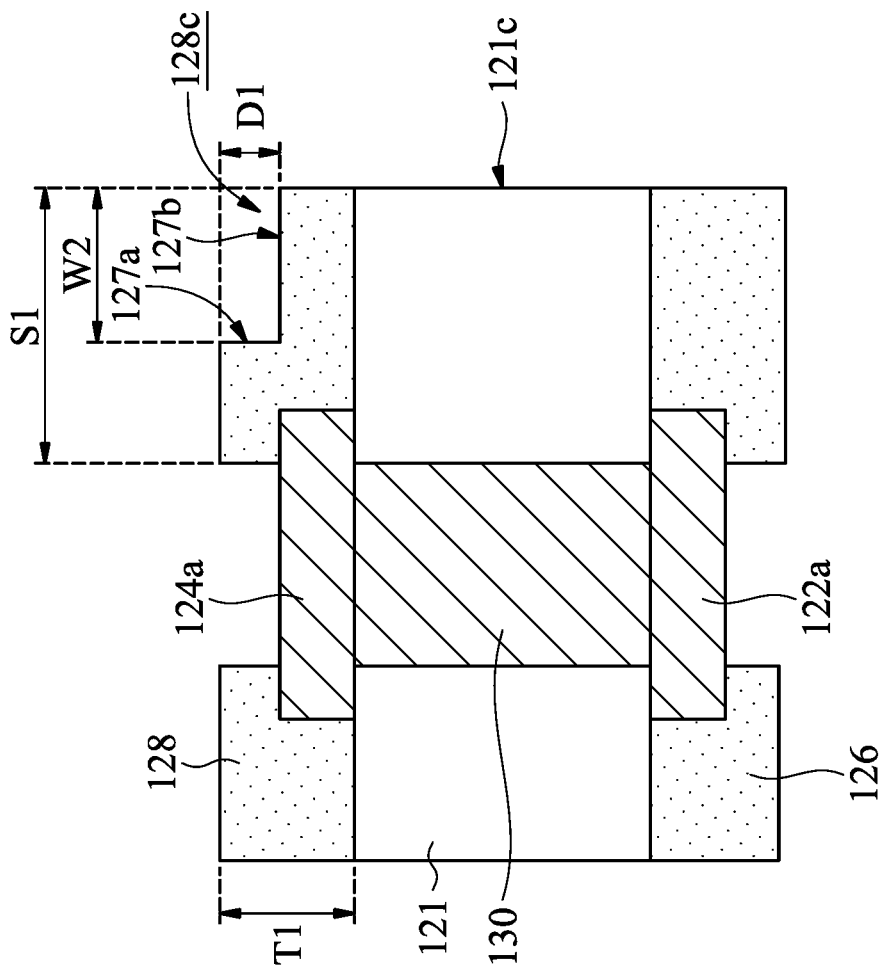
FIG. 9A is an enlarged cross-sectional representation of a recess for the structure shown in FIG. 7D, in accordance with some embodiments.
Figures 9B, 9C:
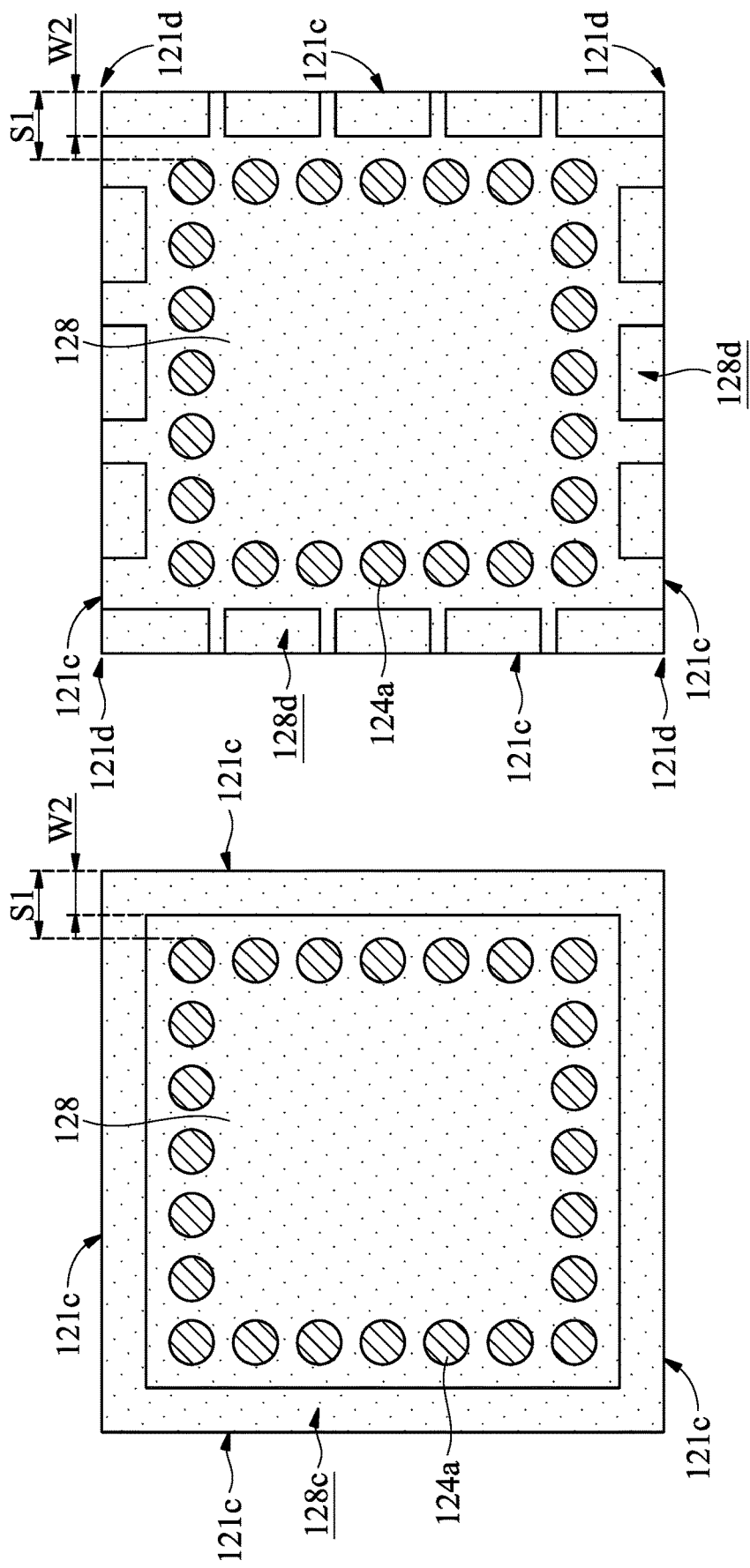
FIG. 9B is a plan view of an interposer structure having the recess shown in FIG. 9A, in accordance with some embodiments.
FIG. 9C is a plan view of an interposer structure having recesses, in accordance with some embodiments.

Referring to FIGS. 9A and 9B, in which FIG. 9A is an enlarged cross-sectional representation of a recess 128*c* for the structure shown in FIG. 7D, in accordance with some embodiments. FIG. 9B is a plan view of the interposer structure 120*a* having the recess 128*c* shown in FIG. 9A, in accordance with some embodiments. The ring-shaped recess 128*c* surrounds the conductive features 124*a* and has a sidewall surface 127*a* and a bottom surface 127*b* extending from the sidewall surface 127*a* to the peripheral edges 121*c* of the insulating base 121, as shown in FIG. 9A and/or FIG. 9B in accordance with some embodiments. As shown in FIG. 9A and/or FIG. 9B, the recess 128*c* has a width W2 and a depth D1. Moreover, the opening formed in the passivation layer 128 to expose the conductive feature 124*a* (e.g., the pad) has a sidewall that is laterally spaced a distance S1 apart from one of the peripheral edges 121*c* (the one that is closest to the sidewall of the opening), and the passivation layer 128 has a thickness T1. In some embodiments, the width W2 of the recess 128*a* is in a range from about 5 μm to about 500 μm and is less than the distance S1. In some embodiments, the thickness T1 of the passivation layer 128 is in a range from about 5 μm to about 50 μm and is greater than or equal to the depth D1 of the recess 128*a*.

Although the passivation layer 128 shown in FIG. 9B has a recess 128*c* with a top-view of a continuous ring-shaped configuration, embodiments of the disclosure are not limited thereto. Many variations and/or modifications can be made to embodiments of the disclosure.

FIG. 9C is a plan view of the interposer structure 120*a* having recesses 128*d*, in accordance with some embodiments. Similar to the recess 128*c* shown in FIG. 9B, each of the recesses 128*d* has a width W2 and a depth D1. Moreover, in some embodiments, the width W2 of the recess 128*d* is in a range from about 5 μm to about 500 μm and is less than the distance S1. Unlike the ring-shaped recess 128*c* shown in FIG. 9B, those recess 128*d* has a top-view of rectangular configuration. Moreover, some of the recesses 128*d* (e.g., first recesses) are arranged at and extended along the peripheral edges 121*c* of the insulating base 121, and some of the recesses 128*d* (e.g., second recesses) are arranged at peripheral corners 121*d* of the insulating base 121 and adjacent to some of the first recesses, so as to form a discontinuous ring surrounding the conductive features 124*a*.

Although the interposer structure 120*a* shown in FIG. 8B includes a passivation layer 128 having a recess 128*a* with a uniform width (e.g., the width W1), embodiments of the disclosure are not limited thereto. Many variations and/or modifications can be made to embodiments of the disclosure.

Figure 10A:
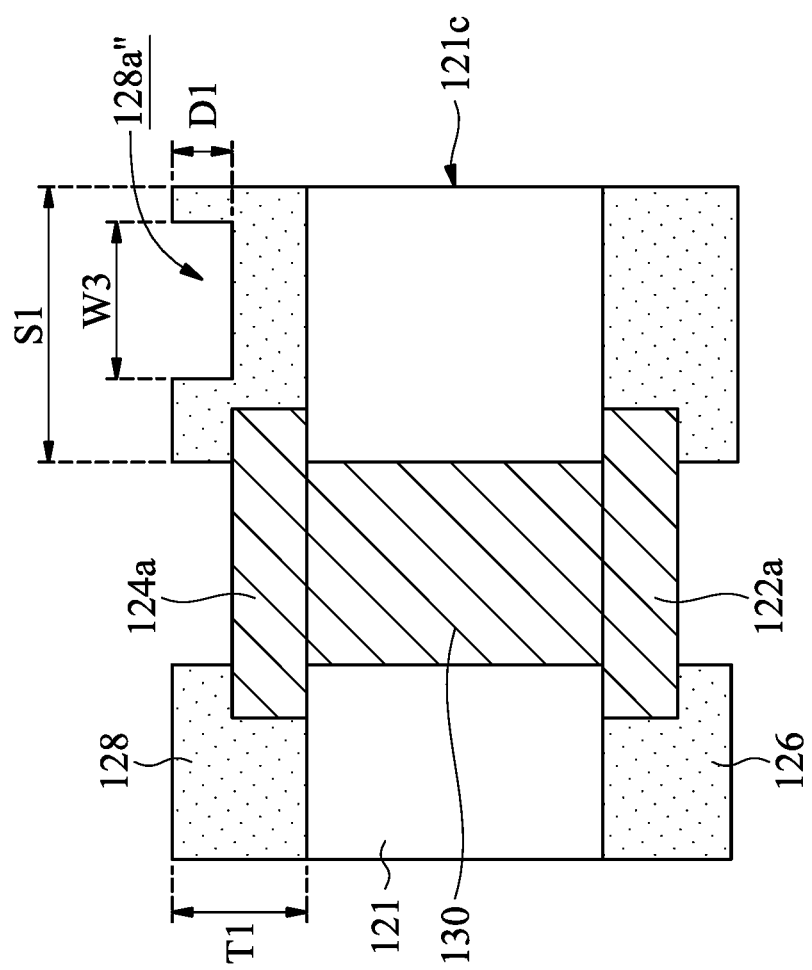
FIG. 10A is an enlarged cross-sectional representation of a recess for the structure shown in FIG. 7D, in accordance with some embodiments.
Figures 10B, 10C:
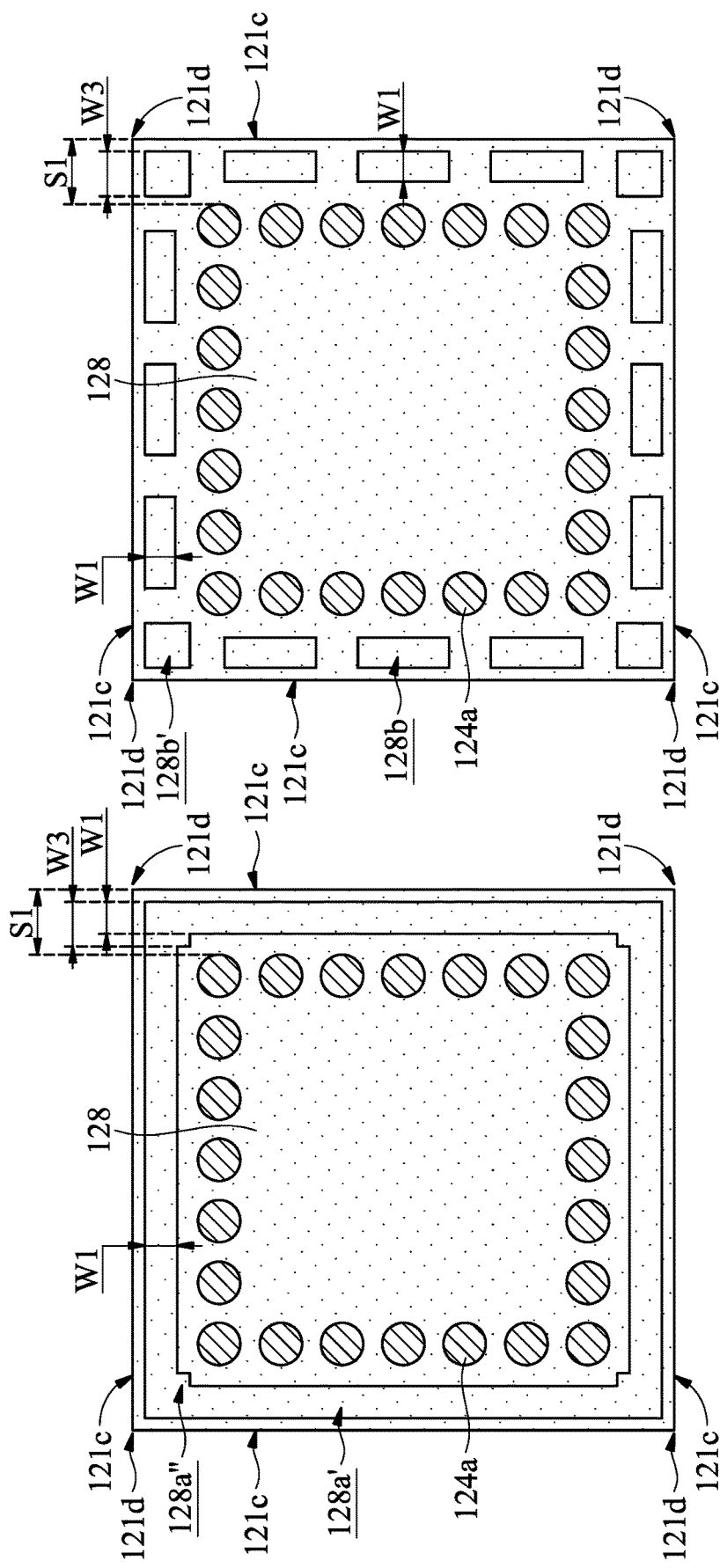
FIG. 10B is a plan view of an interposer structure having the recess shown in FIG. 10A, in accordance with some embodiments.
FIG. 10C is a plan view of an interposer structure having recesses, in accordance with some embodiments.

Referring to FIGS. 10A and 10B, in which FIG. 10A is an enlarged cross-sectional representation of a ring-shaped recess for the structure shown in FIG. 7D, in accordance with some embodiments. FIG. 10B is a plan view of the interposer structure 120*a* having the ring-shaped recess shown in FIG. 10A that has two widths W1 and W3, in accordance with some embodiments. Similar to the ring-shaped recess 128*a* shown in FIG. 8B, the ring-shaped recess surrounds the conductive features 124*a* and is laterally spaced a distance apart from the peripheral edges 121*c* of the insulating base 121, as shown in FIGS. 10A and 10B in accordance with some embodiments. As shown in FIGS. 10A and 10B, the ring-shaped recess has first portions 128*a'* that correspond to the respective peripheral edges 121*c* of the insulating base 121, and second portions 128*a"* adjoining the first portions 128*a'* and that corresponding to the respective peripheral corners 121*d* of the insulating base 121, in accordance with some embodiments. Each of the first portions 128*a'* has a width W1 and each of the second portions 128*a"* has a width W3 that is different from the width W1. In some embodiments, the width W1 is less than the width W3. The first portions 128*a'* and the second portions 128*a"* have the same depth (e.g., the depth D1). Moreover, the opening formed in the passivation layer 128 to expose the conductive feature 124*a* (e.g., the pad) has a sidewall that is laterally spaced a distance S1 apart from one of the peripheral edges 121*c* (the one closest to the sidewall of the opening), and the passivation layer 128 has a thickness T1. In some embodiments, the width W1 and the width W3 are less than the distance S1. In some embodiments, the thickness T1 of the passivation layer 128 is greater than or equal to the depths D1 of the first portions 128*c'* and the second portions 128*c"* of the recess.

Although the passivation layer 128 shown in FIG. 10B has a recess with a top-view of a continuous ring-shaped configuration, embodiments of the disclosure are not limited thereto. Many variations and/or modifications can be made to embodiments of the disclosure.

FIG. 10C is a plan view of the interposer structure 120*a* having recesses 128*b* and 128*b'* with different widths, in accordance with some embodiments. Similar to the recess including the first portions 128*a'* and the second portions 128*a"* shown in FIG. 10B, each of the recesses 128*b* has a width W1 and each of the recesses 128*b'* has a width W3 that is different from the width W1. In some embodiments, the width W1 is less than the width W3. The recesses 128*b* and the recesses 128*b'* have the same depth (e.g., the depth D1). Unlike the ring-shaped recess shown in FIG. 10B, the recesses 128*b* has a top-view of rectangular configuration and the recesses 128*b'* has a top-view of square configuration. Moreover, the recesses 128*b* are arranged at and extended along the peripheral edges 121*c* of the insulating base 121, and the recesses 128*b'* are arranged at peripheral corners 121*d* of the insulating base 121 and adjacent to some of the recesses 128*b*, so as to form a discontinuous ring surrounding the conductive features 124*a*.

Although the interposer structure 120a shown in FIG. 10B includes a passivation layer 128 having a recess including the first portions 128a' and the second portions 128a" that is laterally spaced a distance apart from the peripheral edges 121c of the insulating base 121, embodiments of the disclosure are not limited thereto. Many variations and/or modifications can be made to embodiments of the disclosure.

Figure 11A:
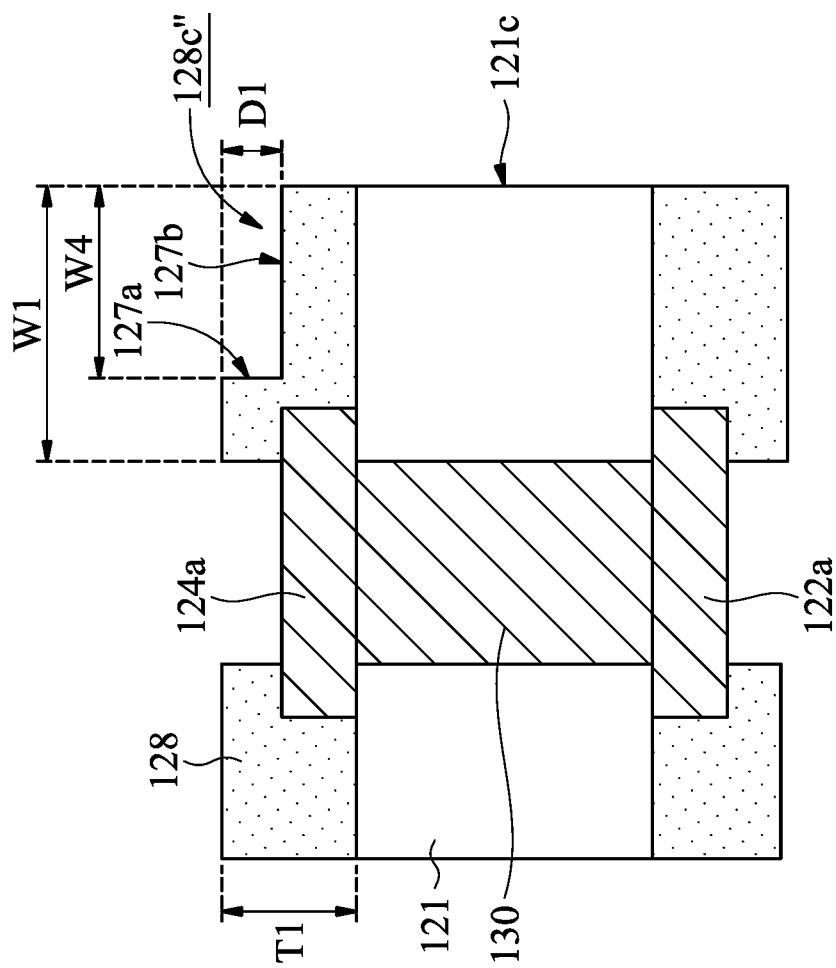
FIG. 11A is an enlarged cross-sectional representation of a recess for the structure shown in FIG. 7D, in accordance with some embodiments.
Figures 11B, 11C:
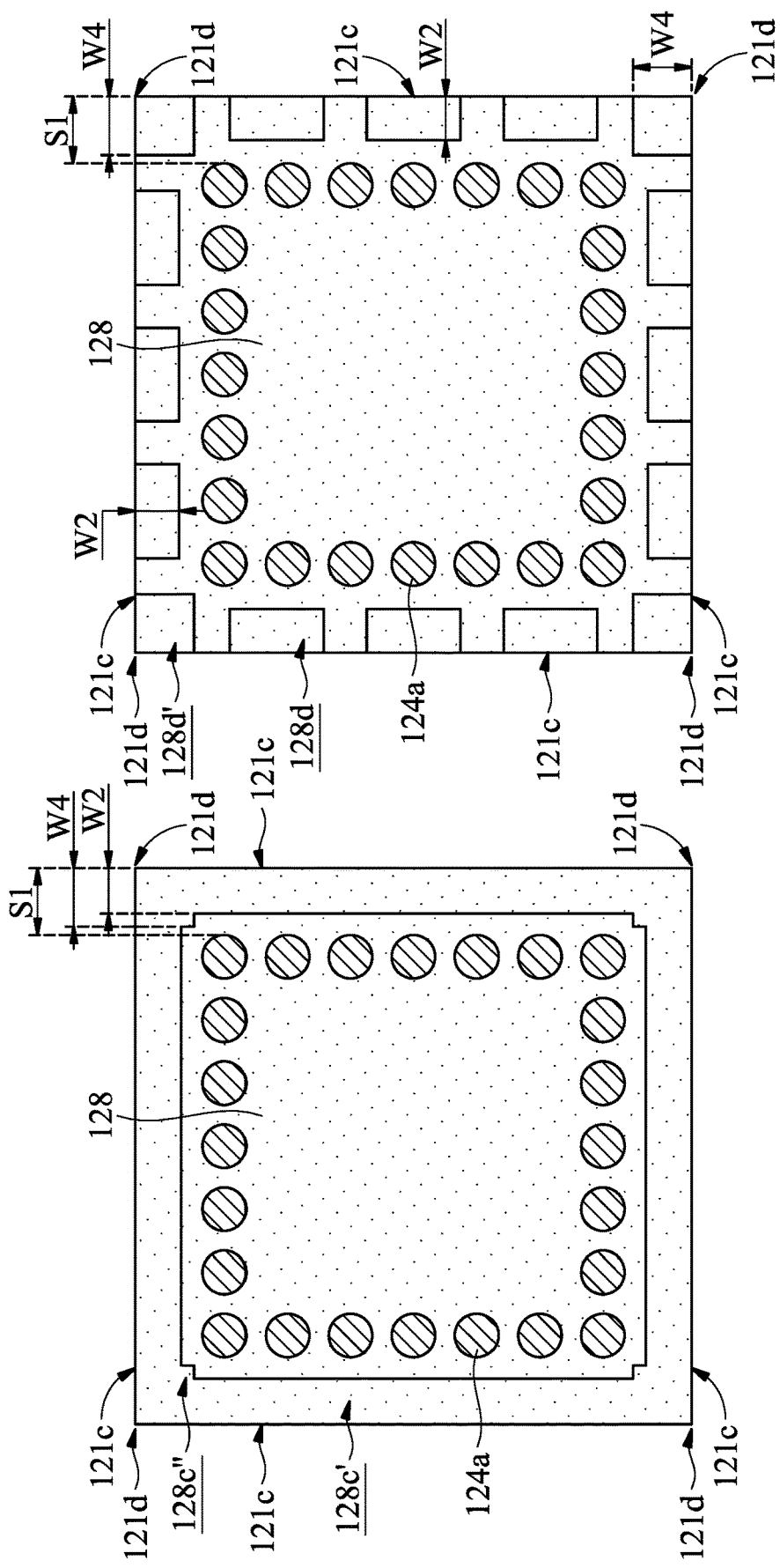
FIG. 11B is a plan view of an interposer structure having the recess shown in FIG. 11A, in accordance with some embodiments.
FIG. 11C is a plan view of an interposer structure having recesses, in accordance with some embodiments.

Referring to FIGS. 11A and 11B, in which FIG. 11A is an enlarged cross-sectional representation of a ring-shaped recess for the structure shown in FIG. 7D, in accordance with some embodiments. FIG. 11B is a plan view of the interposer structure 120a having the ring-shaped recess shown in FIG. 11A that has two widths W2 and W4, in accordance with some embodiments. Similar to the ring-shaped recess shown in FIG. 9B, the ring-shaped recess surrounds the conductive features 124a and has a sidewall surface 127a and a bottom surface 127b extending from the sidewall surface 127a to the peripheral edges 121c of the insulating base 121, as shown in FIGS. 11A and 11B in accordance with some embodiments. As shown in FIG. 11A and/or FIG. 11B, the ring-shaped recess has first portions 128c' that correspond to the respective peripheral edges 121c of the insulating base 121, and second portions 128c" adjoining the first portions 128c' and that correspond to the respectively peripheral corners 121d of the insulating base 121, in accordance with some embodiments. Each of the first portions 128c' has a width W2 and each of the second portions 128c" has a width W4 that is different from the width W2. In some embodiments, the width W2 is less than the width W4. The first portions 128c' and the second portions 128c" have the same depth (e.g., the depth D1). Moreover, the opening formed in the passivation layer 128 to expose the conductive feature 124a (e.g., the pad) has a sidewall that is laterally spaced a distance S1 apart from one of the peripheral edges 121c (the closest one to the sidewall of the opening), and the passivation layer 128 has a thickness T1. In some embodiments, the width W2 and the width W4 are less than the distance S1. In some embodiments, the thickness T1 of the passivation layer 128 is greater than or equal to the depths D1 of the first portions 128c' and the second portions 128c" of the recess.

Although the passivation layer 128 shown in FIG. 11B has a recess with a top-view of a continuous ring-shaped configuration, embodiments of the disclosure are not limited thereto. Many variations and/or modifications can be made to embodiments of the disclosure.

FIG. 11C is a plan view of the interposer structure 120a having recesses 128d and 128d' with different widths, in accordance with some embodiments. Similar to the recess including the first portions 128c' and the second portions 128c" shown in FIG. 11B, each of the recesses 128d has a width W2 and each of the recesses 128d' has a width W4 that is different from the width W2. In some embodiments, the width W2 is less than the width W4. The recesses 128d and the recesses 128d' have the same depth (e.g., the depth D1). Unlike the ring-shaped recess shown in FIG. 11B, the recesses 128d has a top-view of rectangular configuration and the recesses 128d' has a top-view of square configuration. Moreover, the recesses 128d are arranged at and extended along the peripheral edges 121c of the insulating base 121, and the recesses 128d' are arranged at peripheral corners 121d of the insulating base 121 and adjacent to some of the recesses 128d, so as to form a discontinuous ring surrounding the conductive features 124a.

Embodiments of semiconductor packages and methods for forming the same are provided. The semiconductor package includes an interposer structure formed over the encapsulating layer that covers a semiconductor die on the interconnect structure. The interposer structure includes an insulating base and island layers that is arranged on the surface of the insulating base and corresponds to the semiconductor die. The island layers facilitate the flowability of an encapsulating material between the semiconductor die and the interposer structure. As a result, the gap between the semiconductor die and the interposer structure can be filled with the subsequently formed encapsulating layer to prevent voids from forming in the gap, thereby increasing the reliability of the semiconductor package.

In some embodiments, a semiconductor package is provided. The semiconductor package includes an encapsulating layer, a semiconductor die formed in the encapsulating layer, and an interposer structure covering the encapsulating layer. The interposer structure includes an insulating base having a first surface facing the encapsulating layer, and a second surface opposite the first surface. The interposer structure also includes insulting features formed on the first surface of the insulating base and extending into the encapsulating layer. The insulting features are arranged in a matrix and face a top surface of the semiconductor die. The interposer structure further includes first conductive features formed on the first surface of the insulating base and extending into the encapsulating layer. The first conductive features surround the matrix of the plurality of insulting features.

In some embodiments, a semiconductor package is provided. The semiconductor package includes an encapsulating layer, a semiconductor die formed in the encapsulating layer, and an interposer structure formed over the encapsulating layer. The interposer structure includes an insulating base having a first surface facing the encapsulating layer, and a second surface opposite the first surface. The interposer structure also includes a passivation layer covering the second surface of the insulating base. The passivation layer has a ring-shaped recess extending along peripheral edges of the insulating base. The ring-shaped recess has a minimum width greater than a minimum distance between one of the peripheral edges of the insulating base and the ring-shaped recess.

In some embodiments, a semiconductor package is provided. The semiconductor package includes an encapsulating layer, a semiconductor die formed in the encapsulating layer, an interposer structure formed over the encapsulating layer. The interposer structure includes an insulating base having a first surface facing the encapsulating layer, and a second surface opposite the first surface. The interposer structure also includes a passivation layer covering the second surface of the insulating base. The passivation layer has a first recess arranged at a peripheral edge of the insulating base and a second recess arranged at a peripheral corner of the insulating base and adjacent to the first recess. The first recess has a first width greater than a minimum distance between the peripheral edge of the insulating base and the first recess. The second recess has a second width greater than a minimum distance between the peripheral edge of the insulating base and the second recess.

In some embodiments, a semiconductor package is provided. The semiconductor package includes a redistribution structure, a semiconductor die disposed over the redistribution structure, and an interposer structure connected to the redistribution structure through connectors. The interposer structure includes an insulating base having a first surface facing the semiconductor die and a second surface opposite to the first surface and conductive features formed over the insulating base. The conductive features include first portions formed on the first surface of the insulating base and vertically overlapping the semiconductor die, second portions formed on the first surface of the insulating base and located outside a projection area of the semiconductor die in a top view, third portions formed on the second surface of the insulating base and vertically overlapping the semiconductor die, and fourth portions formed on the second surface of the insulating base and located outside the projection area of the semiconductor die in the top view. The interposer structure further includes capping layers covering the first portions of the conductive features and dielectric features in contact with the capping layers and vertically overlapping the semiconductor die.

In some embodiments, a semiconductor package is provided. The semiconductor package includes a redistribution structure, a semiconductor die disposed over the redistribution structure and connected to the redistribution structure through first connectors, and an underfill material formed around the first connectors and partially covering sidewalls of the semiconductor die. The semiconductor package further includes an encapsulating layer formed around the semiconductor die and the underfill material and an interposer structure disposed over the encapsulating layer. The interposer structure includes an insulating base having a first surface and a second surface opposite to the first surface and through vias formed through the insulating base. The interposer structure further includes first conductive features formed on the first surface of the insulating base, and the first conductive features are aligned in a first direction and overlap the semiconductor die in a second direction. The interposer structure further includes capping layers covering the first conductive features and dielectric features partially covering the capping layers and spaced apart from the first conductive features by the capping layers.

In some embodiments, a semiconductor package is provided. The semiconductor package includes an interposer structure. The interposer structure includes an insulating base having a first surface, a second surface opposite to the first surface, a third surface connecting the first surface and the second surface at a first side, and a fourth surface connecting the first surface and the second surface at a second side and through vias formed in the insulating base and extending from the first surface of the insulating base to the second surface of the insulating base. The interposer structure also includes first conductive features formed on the first surface of the insulating base, and each of the first conductive features is spaced apart from each other. The interposer structure further includes capping layers covering the first conductive features, wherein each of the capping layers is spaced apart from each other, second conductive features formed on the second surface of the insulating base, and a passivation layer covering the second conductive features. The semiconductor package further includes a redistribution structure below the interposer structure, a semiconductor die disposed over the redistribution structure and vertically overlapping the first conductive features and the second conductive features, and an encapsulating layer sandwiched between the interposer structure and the semiconductor die and between the interposer structure and the redistribution structure.

In some embodiments, a semiconductor package is provided. The semiconductor package includes an encapsulating layer, a semiconductor die formed in the encapsulating layer, and an interposer structure covering the encapsulating layer. The interposer structure includes an insulating base having a first surface facing the encapsulating layer, and a second surface opposite the first surface. The interposer structure also includes insulting features formed on the first surface of the insulating base and extending into the encapsulating layer. The insulting features are arranged in a matrix and face a top surface of the semiconductor die. The interposer structure further includes first conductive features formed on the first surface of the insulating base and extending into the encapsulating layer. The first conductive features surround the matrix of the plurality of insulting features.

In some embodiments, a semiconductor package is provided. The semiconductor package includes an encapsulating layer, a semiconductor die formed in the encapsulating layer, and an interposer structure formed over the encapsulating layer. The interposer structure includes an insulating base having a first surface facing the encapsulating layer, and a second surface opposite the first surface. The interposer structure also includes a passivation layer covering the second surface of the insulating base. The passivation layer has a ring-shaped recess extending along peripheral edges of the insulating base. The ring-shaped recess has a width greater than a distance between one of the peripheral edges of the insulating base and the ring-shaped recess.

In some embodiments, a semiconductor package is provided. The semiconductor package includes an encapsulating layer, a semiconductor die formed in the encapsulating layer, an interposer structure formed over the encapsulating layer. The interposer structure includes an insulating base having a first surface facing the encapsulating layer, and a second surface opposite the first surface. The interposer structure also includes a passivation layer covering the second surface of the insulating base. The passivation layer has a first recess arranged at a peripheral edge of the insulating base and a second recess arranged at a peripheral corner of the insulating base and adjacent to the first recess. The first recess has a first width greater than a distance between the peripheral edge of the insulating base and the first recess. The second recess has a second width greater than a distance between the peripheral edge of the insulating base and the second recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package, comprising:
an encapsulating layer;
a semiconductor die formed in the encapsulating layer; and
an interposer structure covering the encapsulating layer, comprising:
an insulating base having a first surface facing the encapsulating layer, and a second surface opposite the first surface;
a plurality of insulating features formed on the first surface of the insulating base and extending into the encapsulating layer, wherein the plurality of insulat- ing features is arranged in a matrix which faces a top surface of the semiconductor die;
a plurality of first conductive features formed on the first surface of the insulating base and extending into the encapsulating layer, wherein the plurality of first conductive features surrounds the matrix of the plurality of insulating features; and
a plurality of first through-vias formed in the insulating base to be in direct contact with the plurality of the insulating features.

2. The semiconductor package as claimed in claim 1, wherein the interposer structure further comprises:
a first passivation layer partially covering the first surface of the insulating base and each of the plurality of first conductive features, wherein the plurality of insulating features and the first passivation layer are made of a same insulating layer; and
a second passivation layer covering the second surface of the insulating base.

3. The semiconductor package as claimed in claim 1, wherein the interposer structure further comprises:
a plurality of second conductive features formed on the second surface of the insulating base and in direct contact with the plurality of first through-vias.

4. The semiconductor package as claimed in claim 1, wherein the interposer structure further comprises:
a plurality of second through-vias formed in the insulating base to be in direct contact with the plurality of the first conductive features.

5. The semiconductor package as claimed in claim 4, wherein the interposer structure further comprises:
a plurality of second conductive features formed on the second surface of the insulating base and in direct contact with the plurality of second through-vias.

6. The semiconductor package as claimed in claim 1, further comprising:
an interconnect structure formed below the encapsulating layer and electrically coupled to the semiconductor die; and
a plurality of connectors formed in the encapsulating layer and electrically coupled between the interconnect structure and the plurality of first conductive features.

7. The semiconductor package as claimed in claim 1, wherein a top view of each of the plurality of the insulating features has a square shape.

8. The semiconductor package as claimed in claim 1, wherein a top view of each of the plurality of the insulating features has a circular shape.

9. A semiconductor package, comprising:
an interposer structure, comprising:
an insulating base having a first surface and a second surface opposite the first surface;
a plurality of insulating features formed on the first surface of the insulating base and arranged in a matrix;
a plurality of first conductive features formed on the second surface of the insulating base and corresponding to the plurality of insulating features; and
a plurality of first through-vias formed in the insulating base, wherein each of the plurality of first through-vias has a bottom surface covered by a corresponding insulating feature of the plurality of insulating features, and a top surface covered by a corresponding first conductive feature of the plurality of first conductive features;
an interconnect structure formed below the interposer structure and facing the first surface of the insulating base;
an encapsulating layer filling in a space between the interconnect structure and the interposer structure; and
a semiconductor die formed in the encapsulating layer and having a top surface covered by the matrix.

10. The semiconductor package as claimed in claim 9, wherein the interposer structure further comprises:
a plurality of second conductive features formed on the second surface of the insulating base and surrounding the plurality of first conductive features; and
a plurality of third conductive features formed on the first surface of the insulating base and corresponding to the plurality of second conductive features.

11. The semiconductor package as claimed in claim 10, wherein the interposer structure further comprises a plurality of second through-vias formed in the insulating base, wherein each of the plurality of second through-vias has a bottom surface covered by a corresponding third conductive feature of the plurality of third conductive features, and a top surface covered by a corresponding second conductive feature of the plurality of second conductive features.

12. The semiconductor package as claimed in claim 10, wherein the interposer structure further comprises:
a passivation layer covering the second surface of the insulating base and covering the plurality of first conductive features, wherein the plurality of second conductive features are partially exposed by the passivation layer.

13. The semiconductor package as claimed in claim 10, wherein the interposer structure further comprises:
a passivation layer covering the first surface of the insulating base and surrounding the matrix.

14. The semiconductor package as claimed in claim 10, further comprising:
a plurality of connectors formed in the encapsulating layer and extending into the passivation layer, so as to be correspondingly and electrically connected to the plurality of third conductive features.

15. A semiconductor package, comprising:
a semiconductor die formed over an interconnect structure;
an encapsulating layer surrounding the semiconductor die; and
an interposer structure formed over encapsulating layer, comprising:
an insulating base having a first surface in direct contact with the encapsulating layer, and a second surface opposite the first surface;
a plurality of dummy through-vias formed in the insulating base and arranged in a central portion of the insulating base;
a plurality of through-vias formed in the insulating base and surrounding the plurality of dummy through-vias;
a first passivation layer covering the first surface of the insulating base and having a plurality of pad patterns arranged on a central area of the first surface to cover a bottom surface of each of the plurality of dummy through-vias;
a second passivation layer covering the second surface of the insulating base; and
a plurality of conductive first pads arranged on a central area of the second surface to cover a top surface of each of the plurality of dummy through-vias and covered by the second passivation layer.

16. The semiconductor package as claimed in claim 15, further comprising:
- a plurality of second pads formed over the second surface of the insulating base and partially exposed by the second passivation layer, wherein the plurality of second pads covers a top surface of each of the plurality of through-vias.

17. The semiconductor package as claimed in claim 15, further comprising:
- a plurality of second pads formed over the first surface of the insulating base and surrounding the plurality of pad patterns.

18. The semiconductor package as claimed in claim 15, wherein top views of each of the plurality of pad patterns and each of the plurality of dummy through-vias have a circular shape.

19. The semiconductor package as claimed in claim 18, wherein each of the plurality of dummy through-vias has a diameter less than a diameter of each of the plurality of pad patterns.

20. The semiconductor package as claimed in claim 1, wherein the plurality of first through-vias are vertically overlapped with the semiconductor die.

* * * * *